United States Patent
Tsujikawa et al.

(10) Patent No.: US 7,708,848 B2
(45) Date of Patent: May 4, 2010

(54) COMPONENT BONDING METHOD AND COMPONENT BONDING DEVICE

(75) Inventors: Toshihiko Tsujikawa, Osaka (JP); Hiroshi Uchiyama, Osaka (JP); Akira Yamada, Osaka (JP); Takashi Iwahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 105 days.

(21) Appl. No.: 12/280,705

(22) PCT Filed: Feb. 28, 2007

(86) PCT No.: PCT/JP2007/054362

§ 371 (c)(1),
(2), (4) Date: Aug. 26, 2008

(87) PCT Pub. No.: WO2007/100142

PCT Pub. Date: Sep. 7, 2007

(65) Prior Publication Data

US 2009/0011676 A1 Jan. 8, 2009

(30) Foreign Application Priority Data

Mar. 2, 2006 (JP) ............................. 2006-056523

(51) Int. Cl.
*H01J 9/18* (2006.01)
*G06F 19/00* (2006.01)
(52) U.S. Cl. ..................... 156/64; 382/145; 382/149; 382/151
(58) Field of Classification Search ................... 156/64; 358/145, 149, 151
See application file for complete search history.

(56) References Cited

U.S. PATENT DOCUMENTS

| 5,803,341 A | 9/1998 | Abe |
| 5,858,806 A | 1/1999 | Nishida |
| 6,646,708 B1 | 11/2003 | Muramatsu |

FOREIGN PATENT DOCUMENTS

| JP | 8-330393 | 12/1996 |
| JP | 2002-110733 | 4/2002 |

OTHER PUBLICATIONS

International Search Report issued May 21, 2007 in the International (PCT) Application of which the present application is the U.S. National Stage.

*Primary Examiner*—Khanh Nguyen
*Assistant Examiner*—John Blades
(74) *Attorney, Agent, or Firm*—Wenderoth, Lind & Ponack, L.L.P.

(57) ABSTRACT

Provided is a component bonding method with higher bonding precision in a process of bonding an electrode of a component to an electrode formed on a flat panel. A preliminary press bonding device includes: a control unit which includes a position displacement amount correction unit to which a position displacement amount after the press bonding process is fed back and which corrects the position displacement on the next component to be preliminarily bonded; and a component position determining unit which determines a position of the component using the fed back correction amount. On the other hand, a press bonding device includes a bonding recognition device for use in the recognition of positions of the electrodes on the flat panel and the component. The bonding recognition device includes a position displacement amount calculating unit which calculates the position displacement amount based on the recognized position information.

12 Claims, 23 Drawing Sheets

Template 1300 of matching data of component

TAB board side

Flat panel side

After bonding process

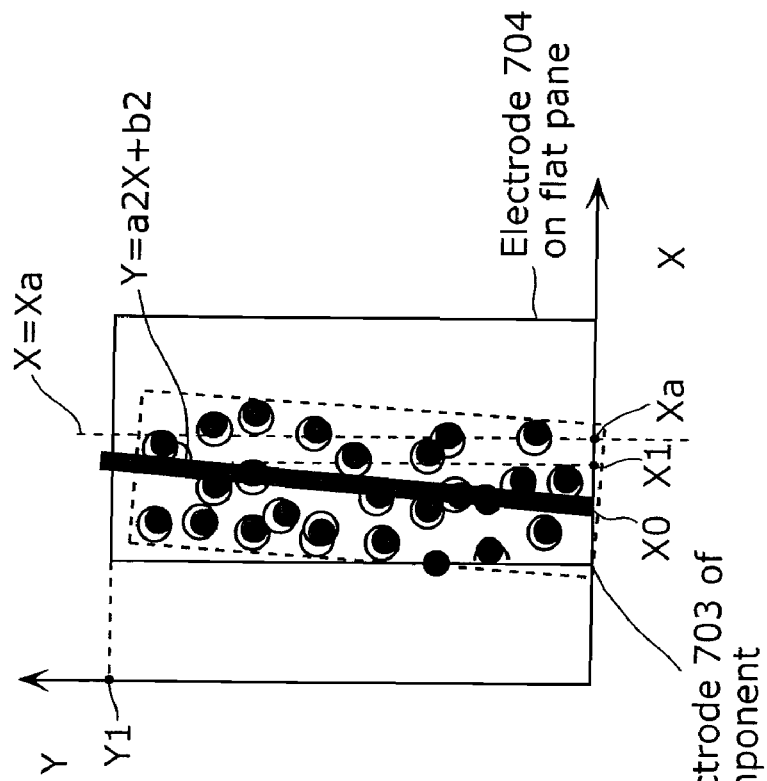
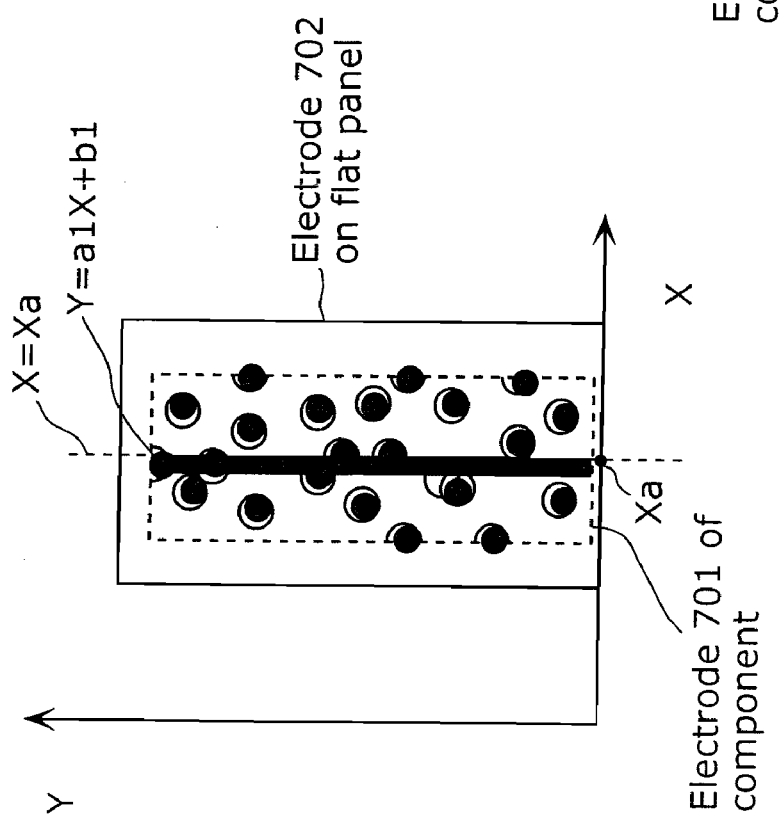

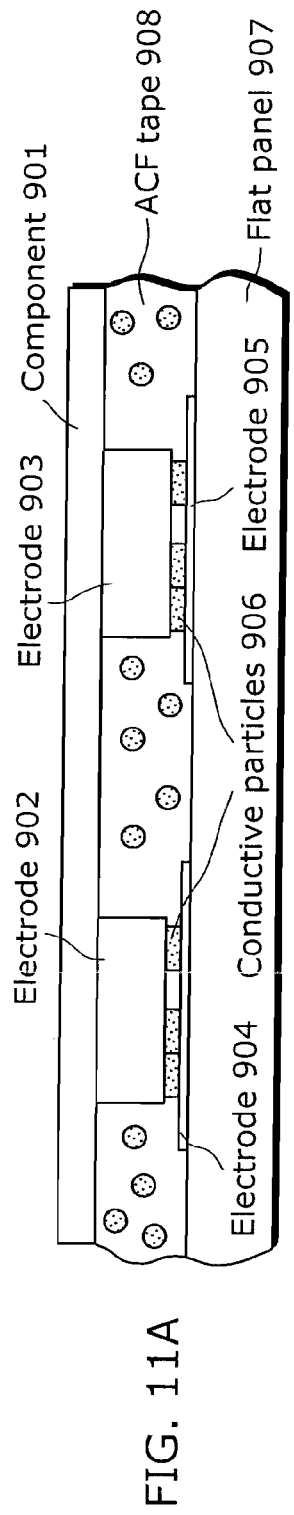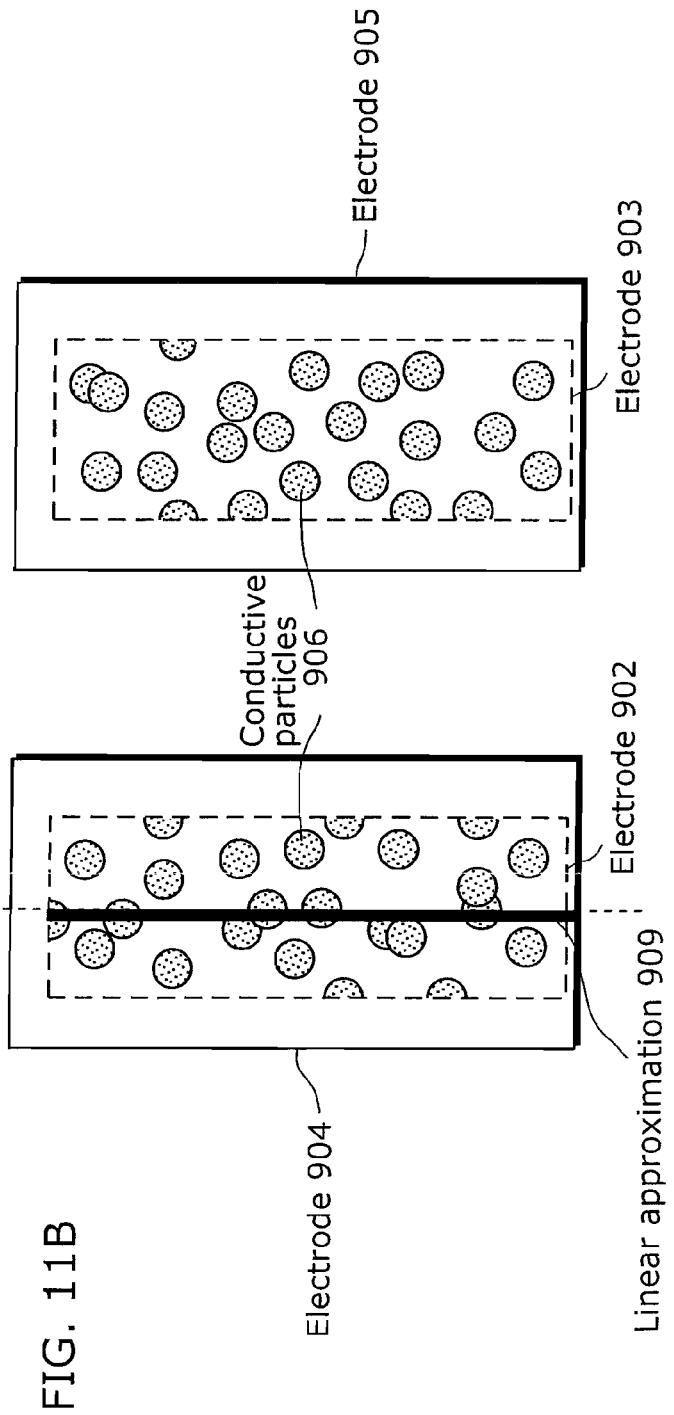
FIG. 11A
FIG. 11B

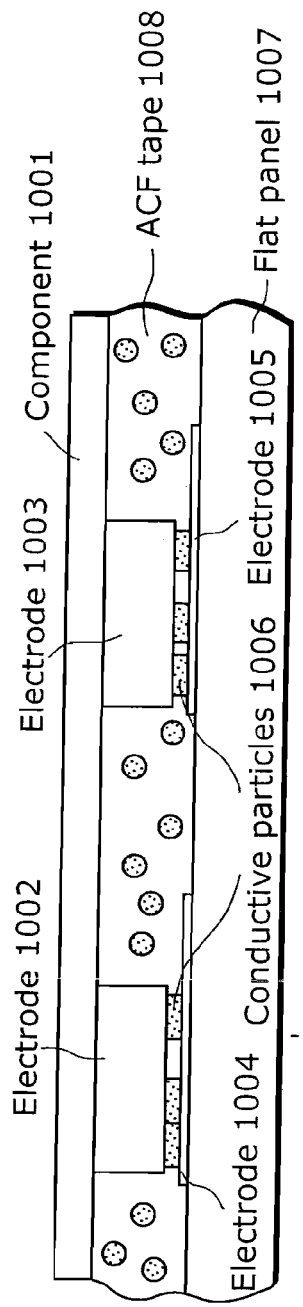
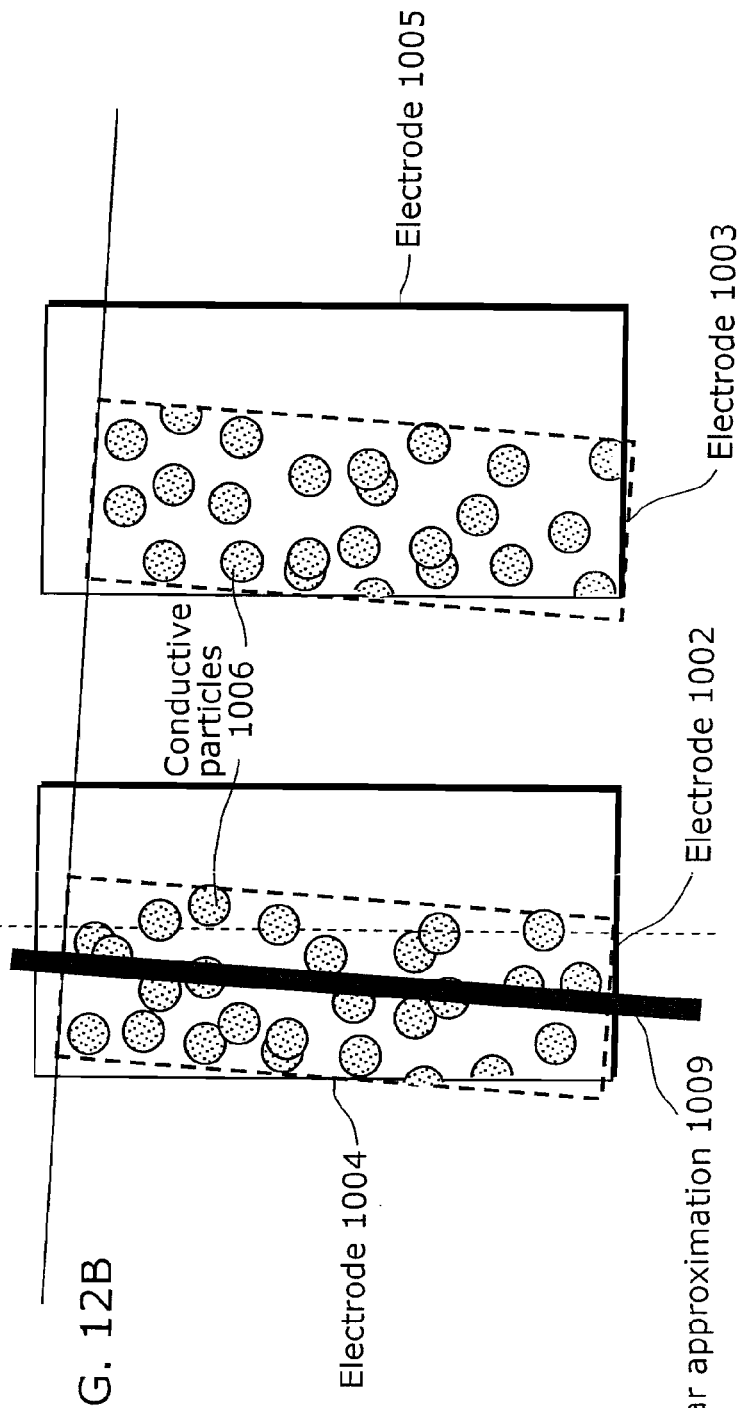
FIG. 12A
FIG. 12B

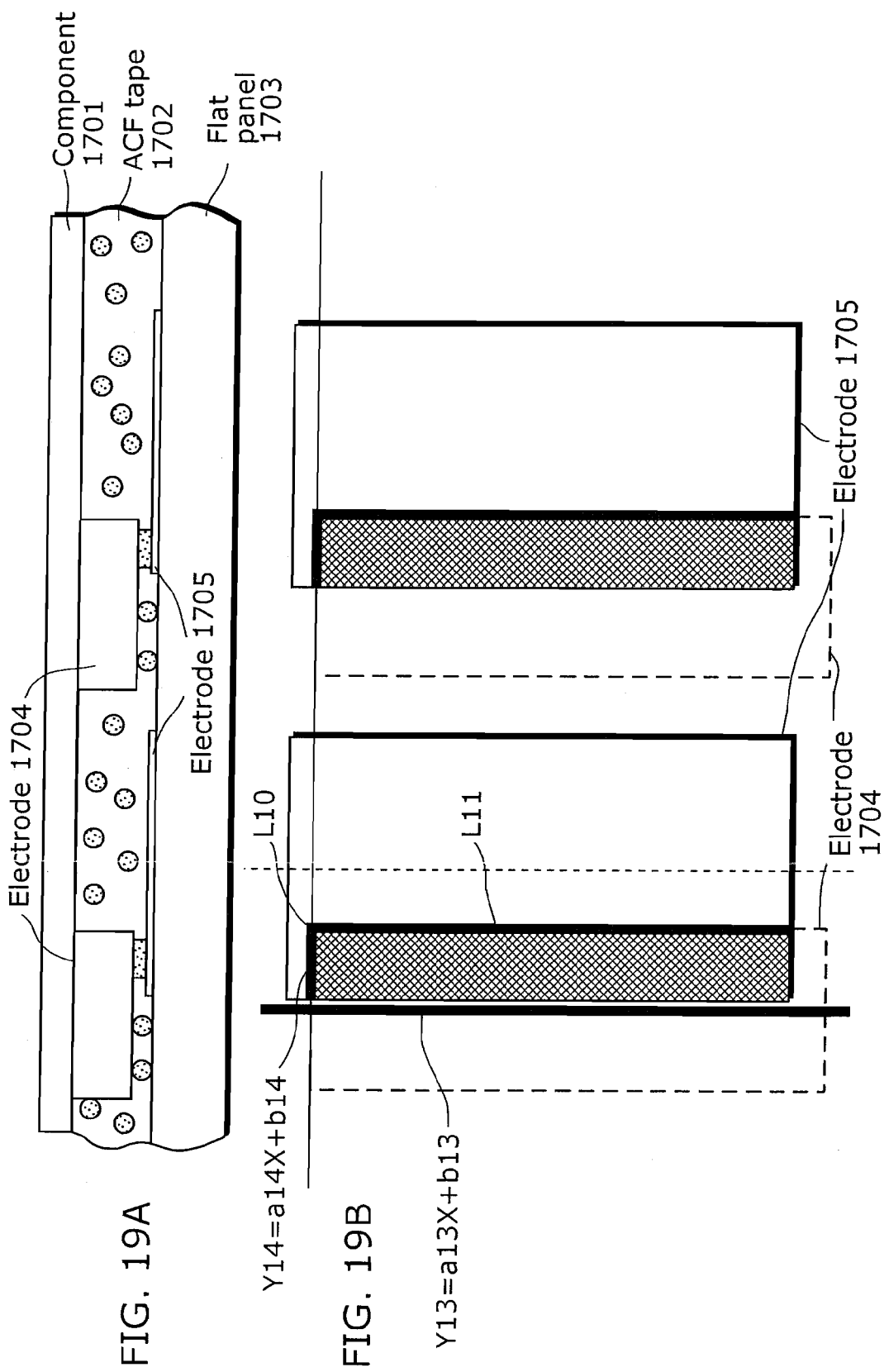

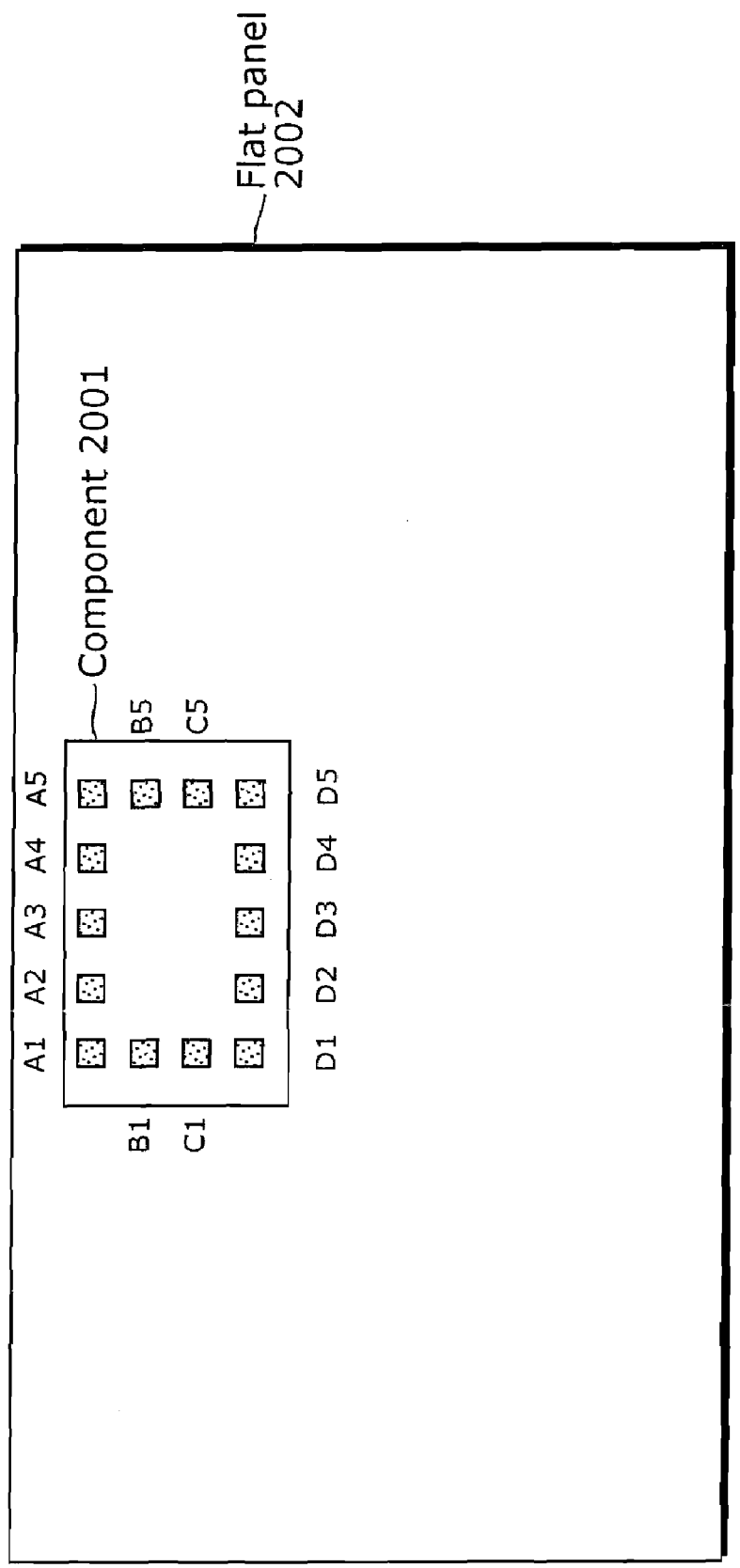

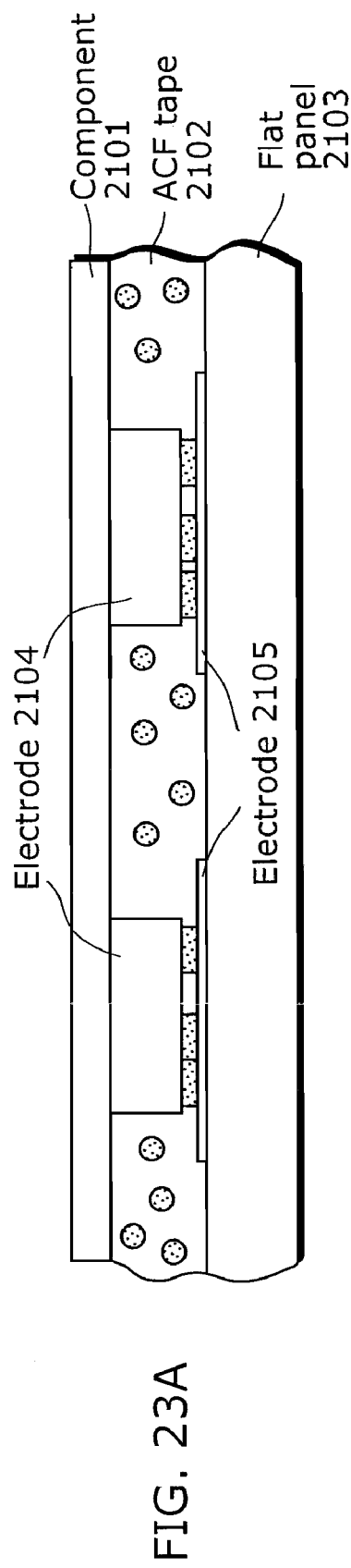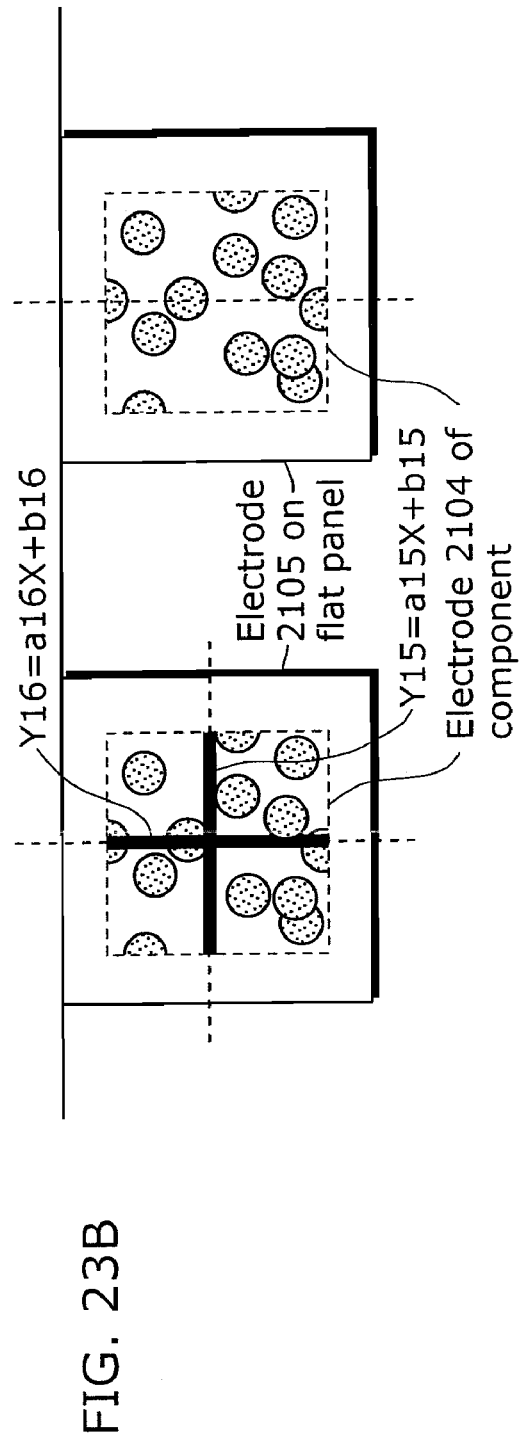
FIG. 23A
FIG. 23B

COMPONENT BONDING METHOD AND COMPONENT BONDING DEVICE

TECHNICAL FIELD

The present invention relates to a component bonding method for bonding a component such as a semiconductor component, to a flat panel display such as a liquid crystal display and a plasma display.

BACKGROUND ART

Conventionally, processes of bonding a component to a flat panel display (hereinafter referred to as flat panel) via an anisotropic conductive material or a film of bonding material (hereinafter referred to as anisotropic conductive film or ACF) includes, for example: an ACF application process in which anisotropic conductive film is applied to an edge portion of the flat panel; a preliminary press bonding process in which an electrode of the component and an electrode formed on the flat panel are matched and the electrode of the component is preliminarily bonded to the electrode of the flat panel; and a press bonding process in which the electrode of the component is pressed to the electrode on the flat panel with a pressing force larger than the force used in the preliminary press bonding process so as to bond the electrode of the component to the electrode on the flat panel.

Then, in order to bond such component to the flat panel, it is necessary to precisely match positions of the electrode of the component and the electrode on the flat panel. Thus, for example, a component bonding method is disclosed in which: first, the component is preliminarily press bonded to the flat panel; a bonding state of recognition marks on the flat panel and on the component is examined from a side opposite to the side where the component is bonded so as to measure a position displacement amount between the component and the flat panel; and this amount is fed back to the next preliminary press bonding process (for example, refer to Patent Reference 1).

FIG. 1 is a flowchart showing an operation procedure of the component bonding method shown in Patent Reference 1.

As shown in the present diagram, after performing a panel input process (S2201), the following processes are performed: an ACF application process (S2202); a preliminary press bonding process in which a position of an electrode on a panel and a position of an electrode of a component are matched (S2203); a bonding recognition process in which the position when the electrode of the component is bonded to the electrode of the flat panel is recognized (S2204); and a position displacement amount calculation process in which an amount of position displacement in the aforementioned bonding process is calculated based on the recognition in the bonding recognition process (S2205).

Then, when the position displacement amount is equal to or more than a predetermined threshold, the amount is fed back as a correction amount for correcting the position displacement in the preliminary press bonding process (S2206). Then, a press bonding process in which the electrode of the panel is bonded to the electrode of the component (S2207) and a panel storage process (S2208) are performed, and the processes are ended.

Note that FIGS. 2A, 2B, and 2C are reference diagrams of recognition marks for recognizing a position of the electrode formed on the component and the flat panel. In the bonding recognition process in FIG. 1 (S2204), a bonding recognition device, such as a camera, recognizes: a recognition mark 2301 provided on a TAB board, as shown in FIG. 2A; and recognition marks 2302 provided on the component, as shown in FIG. 2B. In the position displacement amount calculation process in FIG. 1 (S2205), $\Delta X$ and $\Delta Y$ which are the position displacement amounts as shown in FIG. 2C are calculated.

Patent Reference 1: Japanese Laid-Open Patent Application No. 8-330393

However, in the method according to Patent Reference 1, there is a problem that when the position displacement amount is measured by recognizing the recognition marks on the component and on the flat panel on which the preliminary press bonding process has been performed, it is not possible to recognize whether or not the electrode of the component is precisely bonded to the electrode on the flat panel in which the press bonding process has been performed.

In other words, even when the positions of the electrode on the flat panel and the electrode of the component are matched using each of the recognition marks, there are cases where the state in which the electrode of the component is bonded to the electrode on the flat panel varies between the preliminary press bonding process and the press bonding process due to external factors, such as a temperature of the environment, a degree of parallelism of a pressing device which presses the component, and a degree of parallelism of a backup stage pressing device at the flat panel side. In such cases, even when the position is corrected using the position displacement amount obtained in the preliminary press bonding process, the position correction may not always be appropriate one in the press bonding process.

Furthermore, in the component bonding method in Patent Reference 1, a position displacement amount is corrected using the recognition marks on the flat panel and the component. Thus, for example, in the case where the position of the electrode on the flat panel and the position of the electrode of the component are displaced relative to the positions of each of the recognition marks, even when the position of the electrode on the flat panel and the position of the electrode of the component are matched with respect to each of the recognition marks, there is a problem that the actual bonding is not appropriately performed.

In particular, in the manufacturing process, the distance between electrodes on the flat panel and the distance between electrodes of the component are kept almost constant. However, during a period after manufacturing the flat panel until the actual bonding process, due to the peripheral environment, the operation environment, and the like, there are cases where the position of the electrode on the flat panel and the position of the electrode of the component are displaced relative to the position of each of the recognition marks. In such cases, even when the positions of the electrodes on the flat panel and of the component are matched using the recognition marks which indicates each of the reference positions, there is a problem that it is not possible to precisely match the position of the electrode of the component and the position of the electrode on the flat panel.

Furthermore, since conventionally, the size of the component which is bonded to the flat panel is relatively large, when the electrode of the component is bonded to the electrode on the flat panel with a certain amount of position displacement, a defective bonding has never occurred. However, in recent years, with the progress in miniaturization and high precision of components, much higher bonding precision is required. For example, a diameter of a conductive particle included in an anisotropic conductive film is approximately 5 µm, and the length is being reduced. In addition, the dimension of a line which is a width of an electrode and a space which is a gap between electrodes are becoming such narrower as to be equal to or less than 20 µm. With such miniaturization, further improved bonding precision is required.

Furthermore, since a preliminary press bonding device and a press bonding device operate independently from each other in the conventional component mounting apparatus, the process in which the position displacement amount in the press bonding process is fed back to the preliminary press bonding process as the correction amount has not been achieved yet.

The present invention is to solve the aforementioned problems, and the object is to provide a component bonding method with higher bonding precision, when an electrode of a component is bonded to an electrode formed on a flat panel.

Furthermore, another object is to provide a component bonding method using a new position correction method which is other than the position correction method based on the position recognition using recognition marks formed on the component and the flat panel.

DISCLOSURE OF INVENTION

In order to solve the aforementioned problems, the component bonding method according to the present invention is a component bonding method for bonding an electrode of a component via an adhesive film to an electrode formed on an edge portion of a flat panel, and the method includes: preliminarily press bonding the electrode of the component via the adhesive film to the electrode on the flat panel after matching a position of the electrode on the flat panel and a position of the electrode of the component; press bonding the electrode of the component to the electrode on the flat panel; detecting the position of the electrode on the flat panel and the position of the electrode of the component after the press bonding; calculating a position displacement amount between the electrode of the component and the electrode on the flat panel based on the result obtained in the detecting; and correcting the position of the electrode of the component, in the preliminarily press bonding, using the position displacement amount as a correction amount.

With this configuration, the component bonding method according to the present invention can feed back the position displacement amount between the electrode of the component and the electrode on the flat panel which has been detected after the press bonding, as a position correction amount in the preliminary press bonding. Thus, it becomes possible to achieve higher bonding precision for a component.

Furthermore, according to the component bonding method of the present invention, the detecting includes detecting recognition marks formed on the flat panel and the component, and the calculating includes calculating, as the position displacement amount, a difference between position data of the recognition mark on the flat panel and position data of the recognition mark on the component.

With this configuration, the positions of the recognition marks formed on the component and the flat panel are detected in the position detection after the press bonding, and the position displacement amount is calculated by calculating the difference between the recognition marks in the detecting of position displacement amount so that the amount can be used in the preliminary press bonding.

Furthermore, according to the component bonding method of the present invention, the adhesive film includes conductive particles for conduction of electricity between the electrode of the component and the electrode on the flat panel, the detecting further includes detecting a position data group of indentations of the conductive particles formed on an electrode area on the flat panel after the press bonding, and the calculating includes calculating the position displacement amount using the position data group of the indentations.

With this configuration, it is possible that the position data group of the indentations of the conductive particles formed on the flat panel is detected in the position detection after the press bonding, and the position displacement amount is calculated in the detecting of position displacement amount by calculating the linear approximation based on the position data group. Thus, it becomes possible to calculate the position displacement amount using a method other than the detection method of position displacement amount using the conventional recognition marks.

Furthermore, the component bonding method of the present invention further includes judging that a defective bonding has occurred between the electrode of the component and the electrode on the flat panel when the position displacement amount calculated in the calculating is equal to or more than a predetermined value or when an area of the electrode of the component which is pressed to the electrode on the flat panel is equal to or less than a predetermined value.

With this configuration, in the judging, it is possible to judge, based on the position displacement amount calculated in the detecting of position displacement amount, whether the bonding state in which the electrode of the component is bonded to the electrode on the flat panel is defective or not.

Note that in order to achieve the aforementioned object, the present invention can be used as a program having the units of the component bonding method as steps, but also as a component bonding device including such steps as the units, and as a component mounting apparatus including the component bonding device.

With the component bonding method according to the present invention, the position displacement amount between the electrode of the component and the electrode on the flat panel is calculated after the press bonding, and the position displacement amount is used as a position correction amount in the preliminary press bonding. Thus, it becomes possible to achieve higher bonding precision.

Furthermore, for calculating the position displacement amount in the press bonding, the position displacement amount can be calculated using the position data group of the indentations of the conductive particles included in the ACF which have been generated in the electrode area on the flat panel, which is the method other than the method using the difference between the recognition marks formed on the component and the flat panel. Thus, it becomes possible to achieve higher bonding precision.

FURTHER INFORMATION ABOUT TECHNICAL BACKGROUND TO THIS APPLICATION

The disclosure of Japanese Patent Application No. 2006-056523 filed on Mar. 2, 2006 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIGS. 9A and 9B are diagrams describing a position displacement amount calculation method for use in the component bonding method according to the first embodiment.

FIGS. 11A and 11B are sectional views describing a relationship between electrodes formed on a component and indentations of conductive particles included in an ACF tape.

FIGS. 12A and 12B are sectional views describing a relationship between electrodes formed on a component and indentations of conductive particles included in an ACF tape.

FIGS. 19A and 19B are diagrams describing edge detection for use in the component bonding method according to the third embodiment.

FIG. 22 is a diagram describing a position displacement amount calculation method for use in the component bonding method according to the fifth embodiment.

FIGS. 23A and 23B are diagrams describing a position displacement amount calculation method for use in the component bonding method according to the fifth embodiment.

BEST MODE FOR CARRYING OUT THE INVENTION

The embodiment of the component bonding method according to the present invention is described with reference to the diagrams.

First Embodiment

Figure 1:
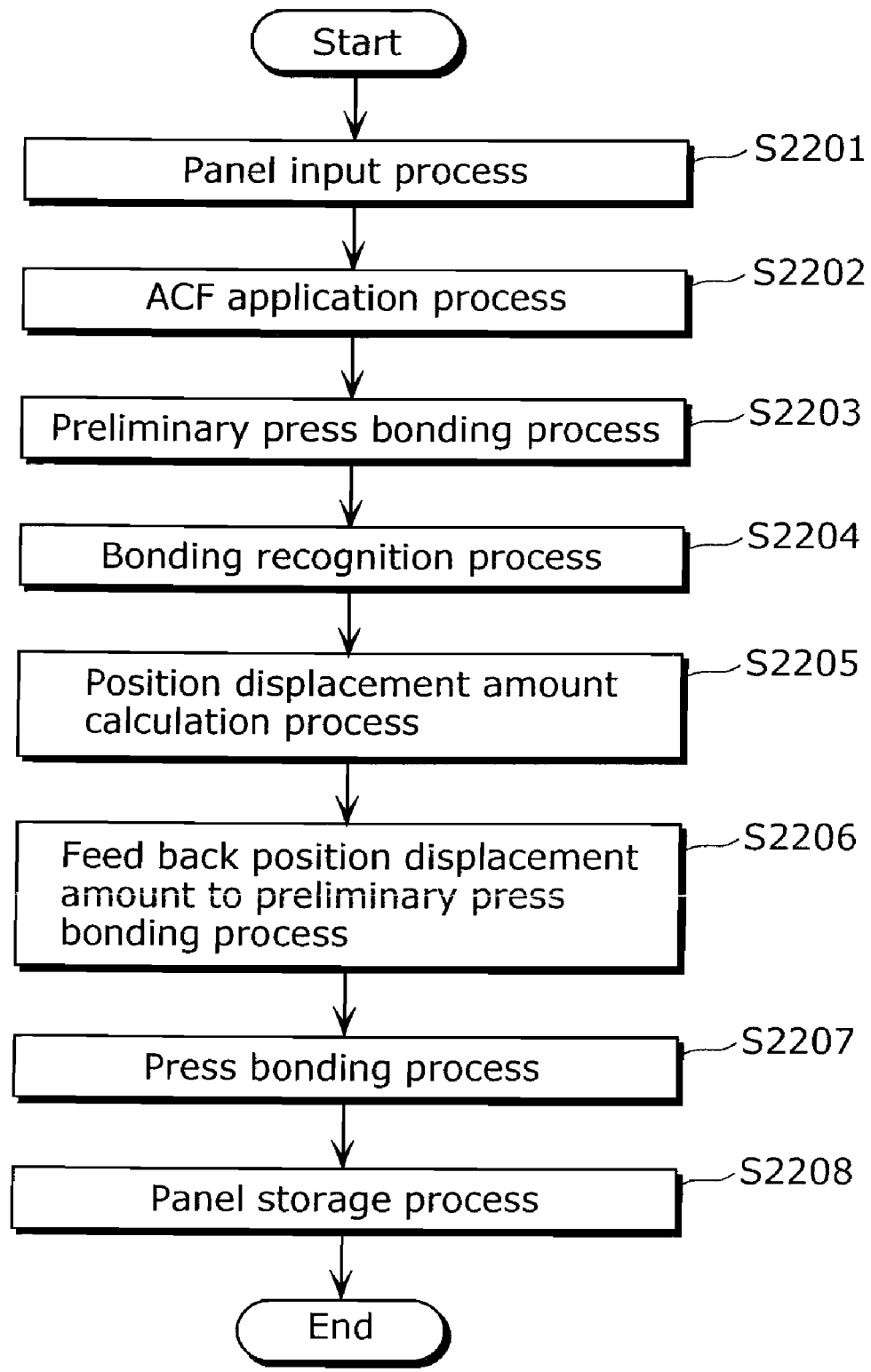
FIG. 1 is a flowchart showing an operation procedure of the component connecting method shown in Patent Reference 1.
Figure 2A:
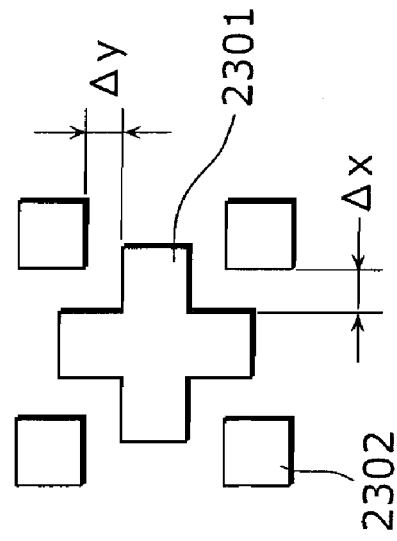
FIGS. 2A, 2B, and 2C are reference diagrams of recognition marks for recognizing positions of electrodes formed on a component and a plat panel.
Figure 2B:
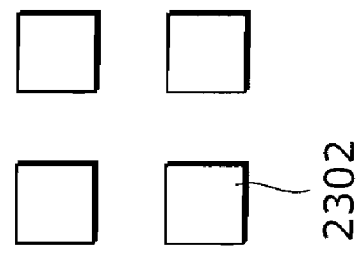
Figure 2C:
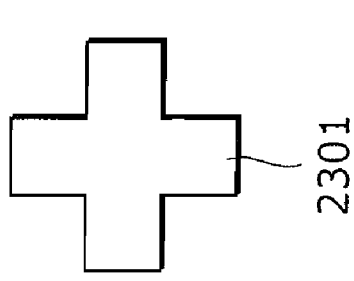
Figure 3:
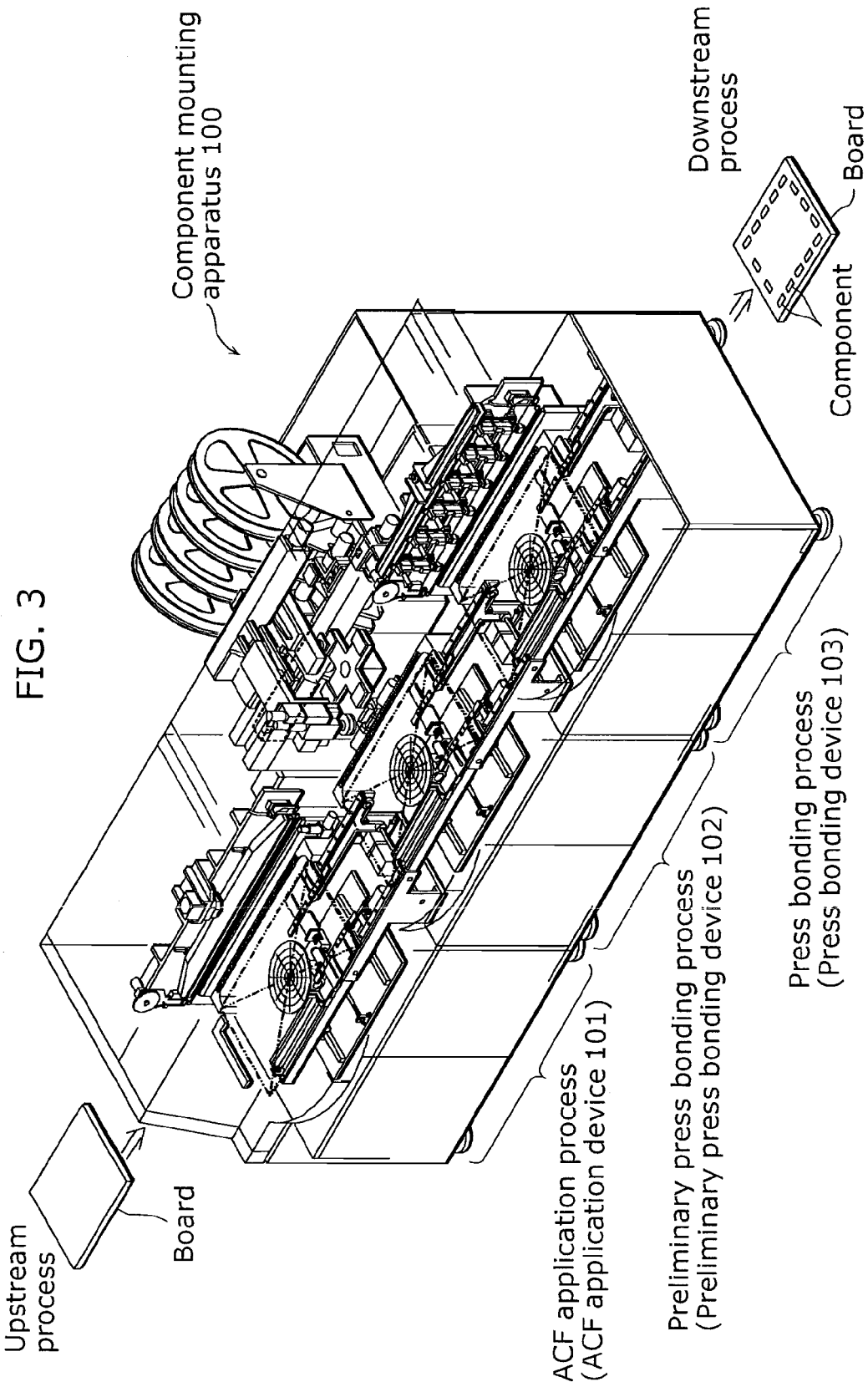
FIG. 3 is an external view of a component mounting apparatus using the component bonding method according to the first embodiment.

FIG. 3 shows an external view of a component mounting apparatus 100 using the component bonding method according to the first embodiment.

The processes of this assembly-type component mounting apparatus 100 includes: the first process of an ACF application process in which an anisotropic conductive film (ACF tape) is applied to a flat panel; the second process of a preliminary press bonding process in which a component, such as a semiconductor component is preliminarily press bonded to the flat panel; and the third process of a press bonding process in which the semiconductor component is finally press bonded to the flat panel.

In the ACF application process, an ACF application device 101 is provided. This ACF application device 101 includes a backup stage, a bow correction unit, a panel stage, an XY table, an ACF supplying unit, and the like.

Figure 8:
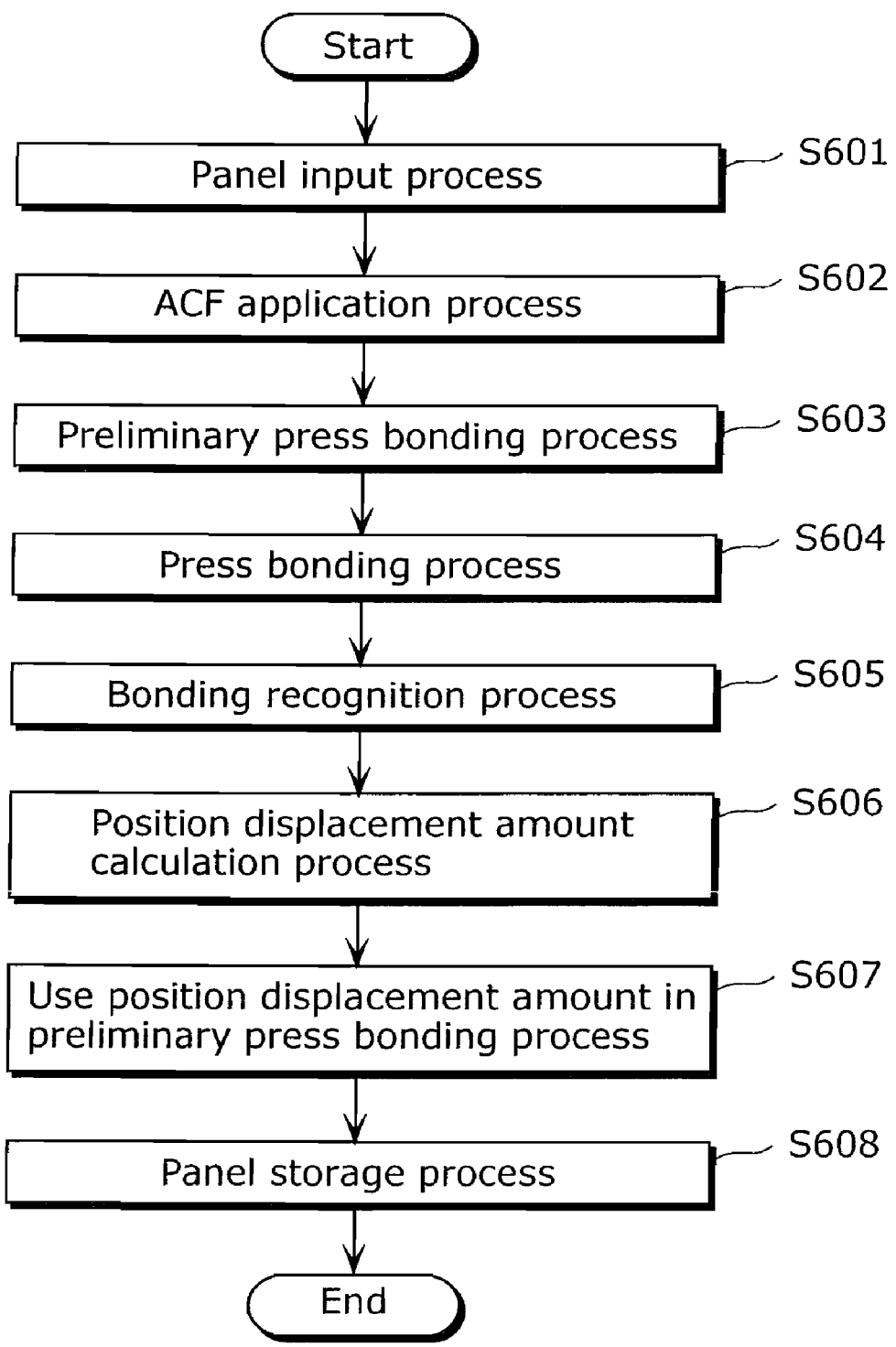
FIG. 8 is a flowchart showing the operation procedure of the component bonding method according to the first embodiment.

FIG. 8 is a flowchart showing the operation procedure of the component bonding method according to the first embodiment. Note that in the component bonding method according to the first embodiment, a position displacement amount is calculated after the press bonding process and the calculated position displacement amount is used in the preliminary press bonding process.

First, a flat panel is carried into the ACF application device 101 (S601), and then an adhesive tape containing conductive particles each with the approximate diameter of 5 μm is applied, using an ACF application head, between the flat panel and the semiconductor component at the backup stage. Then, the semiconductor component is heated and pressed to the flat panel, and the process proceeds to the ACF application process in which an anisotropic conductive film tape which electrically connects the electrode of the semiconductor component to the electrode on the flat panel with the aforementioned conductive particles is applied to the flat panel (S602). Thus, it becomes possible to conduct electricity between the semiconductor component and the flat panel by applying the ACF film tape.

Next, the flat panel is carried into a preliminary press bonding device 102 which includes a component supplying unit, a backup stage, an XY table, and the like.

In this preliminary press bonding process, the position of the semiconductor component supplied from the component supplying unit using a TCP tape and the like is matched, at the backup stage, with a position of an edge portion of the flat panel, and then the preliminary press bonding process is performed in which the semiconductor component is mounted on the ACF film tape which has been applied to the flat panel (S603).

Then, the preliminary press bonding device 102 includes the component supplying unit which extracts the semiconductor component bonded to the edge portion of the flat panel via a tray or the TCP tape (cut out of a tape using a die).

Next, the press bonding process is performed in which the semiconductor component is finally press bonded to the flat panel (S604). A press bonding device 103 shown in FIG. 3 includes a bow correction unit, a backup stage, a pressing head, a panel stage, a seat supplying unit, an XY stage, and the like.

Figure 4A:
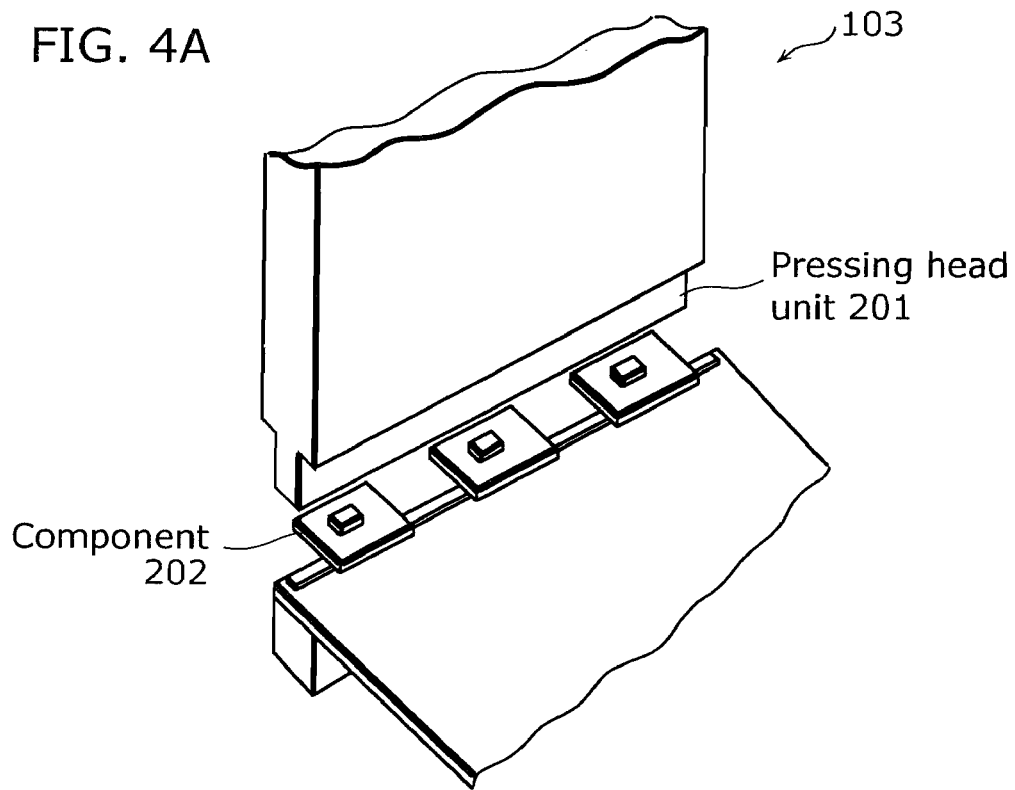
FIGS. 4A and 4B are diagrams describing a batch pressing mode and an individual pressing mode for use in a press bonding device.
Figure 4B:
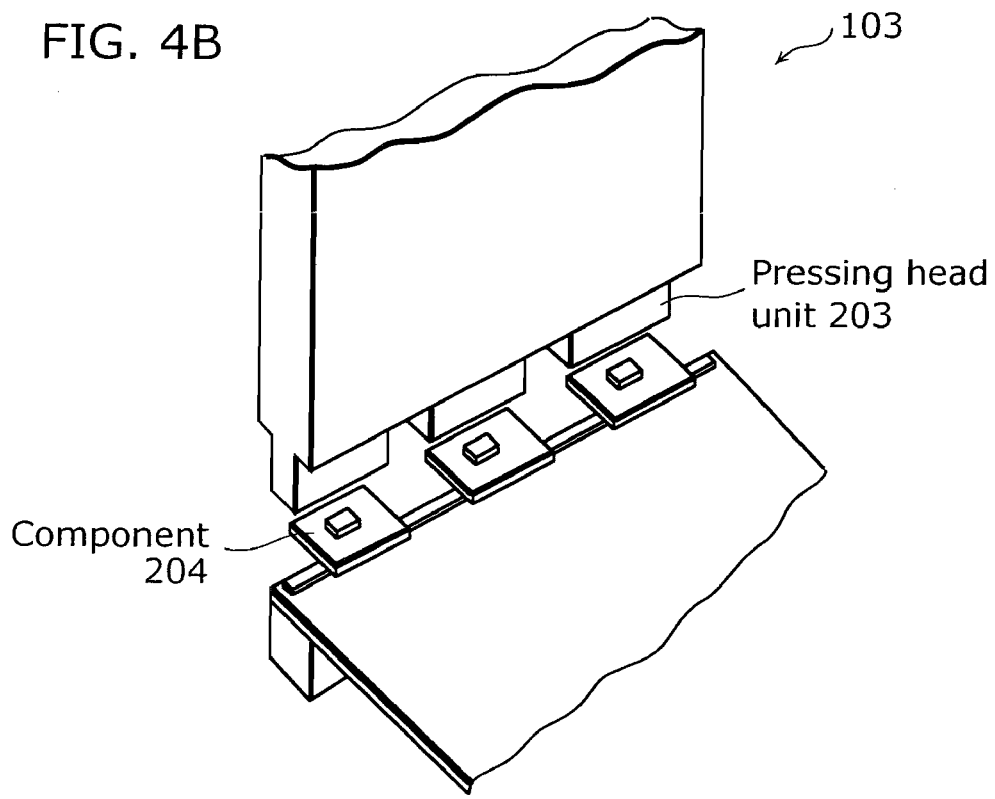

In this press bonding device 103, while heating processing and pressing processing are performed using the pressing head which exerts force at the backup stage, the preliminary pressed semiconductor component is press bonded to the edge portion of the flat panel. Note that a batch pressing mode in which a pressing head unit 201 which presses a batch of components 202 as shown in FIG. 4A, and an individual pressing mode in which a pressing head unit 203 which respectively presses components 204 as shown in FIG. 4B are provided in the press bonding process. Note that a batch pressing device which presses a batch of components is used for describing the first embodiment.

Furthermore, a control panel which is a controller is used for operating each process in the ACF application device 101, the preliminary press bonding device 102, and the press bonding device 103.

Then, in the present invention, after the press bonding process, a bonding recognition process is performed in which a position when the electrode of the component is bonded to the electrode of the flat panel is recognized using a differential interference microscope (S605). Then, based on the recognition in the bonding recognition process, a position displacement amount calculation process is performed in which a position displacement amount between the electrode of the component and the electrode on the flat panel is calculated (S606). In this position displacement amount calculation process, for example, it is possible to simply calculate, as a position displacement amount, a difference between position data of the recognition mark on the flat panel and position data of the recognition mark on the component. Alternatively, it is possible to calculate the position displacement amount using the position data group of indentations of conductive particles contained in the anisotropic conductive film after the press bonding process as described hereinafter.

Next, when the position displacement amount is equal to or more than a predetermined threshold, the following processes are performed: a process in which this position displacement amount is fed back to the preliminary press bonding process (S607); and a panel storage process in which the flat panel on which the components have been mounted is stored (S608). Then, the processes are ended.

Note that it is difficult to recognize the bonding state between the electrode on the flat panel and the electrode of the component in the aforementioned preliminary press bonding process, from the crushed state of the conductive particles contained in the anisotropic conductive film. This is because the pressing force is small in the preliminary press bonding process so that it is difficult to recognize the bonding state between the electrodes. Thus, in the component bonding method according to the present invention, the press bonding process is performed with a pressing force larger than the force used in the preliminary press bonding process. Then, the position of the electrode of the component is corrected by detecting the position data group of the indentations of the conductive particles in the case where an entire area of the anisotropic conductive film where the electrode on the panel and the electrode of the component overlap has been crushed.

Furthermore, in the description of the present embodiment, the flat panel display is a transparent panel made of a glass and the like. As the types of this flat panel, there are: a liquid crystal display (LCD) panel; a glass panel, such as a plasma display panel (PDP); and a panel including a flexible printed circuit (FPC).

Furthermore, the components bonded to the flat panel are, for example, components, such as a flexible printed circuit on which a semiconductor device, a TAB board, and a semiconductor component are mounted, and regardless of whether it is transparent or non-transparent, as long as the component has an electrode which can be bonded to the electrode on the flat panel, it may be available as a component bonded to a flat panel. Note that the electrode on the flat panel or on the component may be a bump.

Figure 5A:
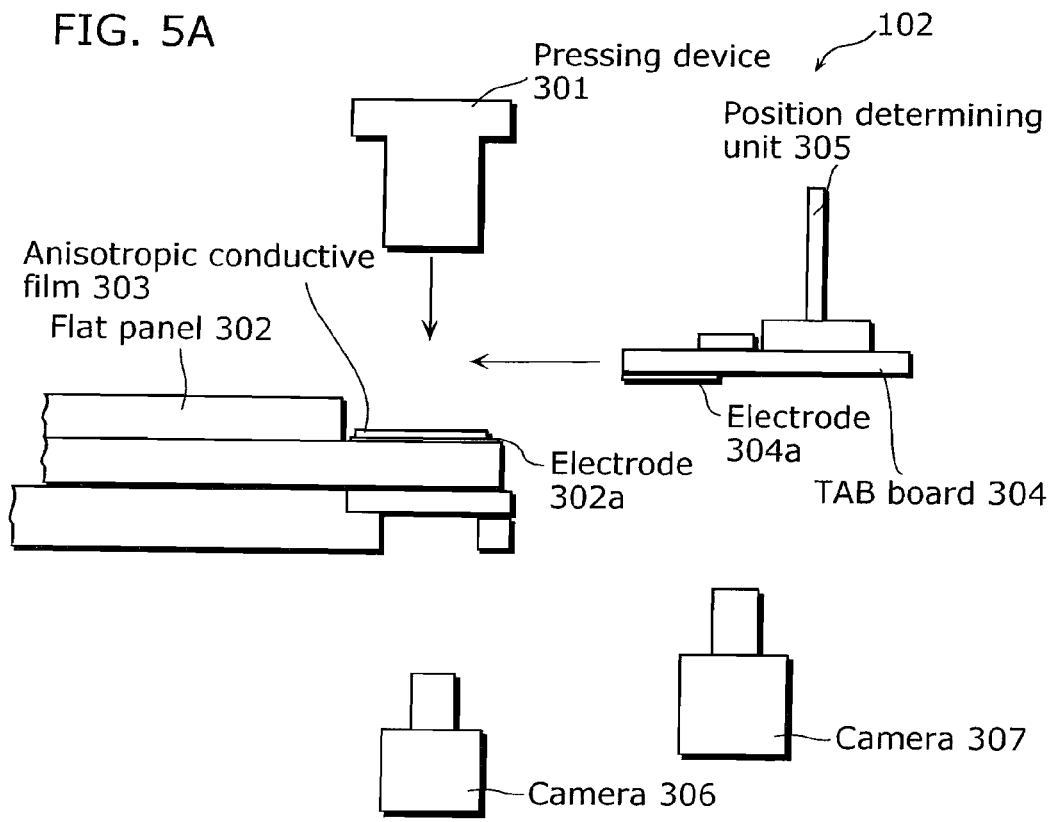
FIGS. 5A and 5B are reference diagrams describing operations of preliminary press bonding device shown in FIG. 3.
Figure 5B:
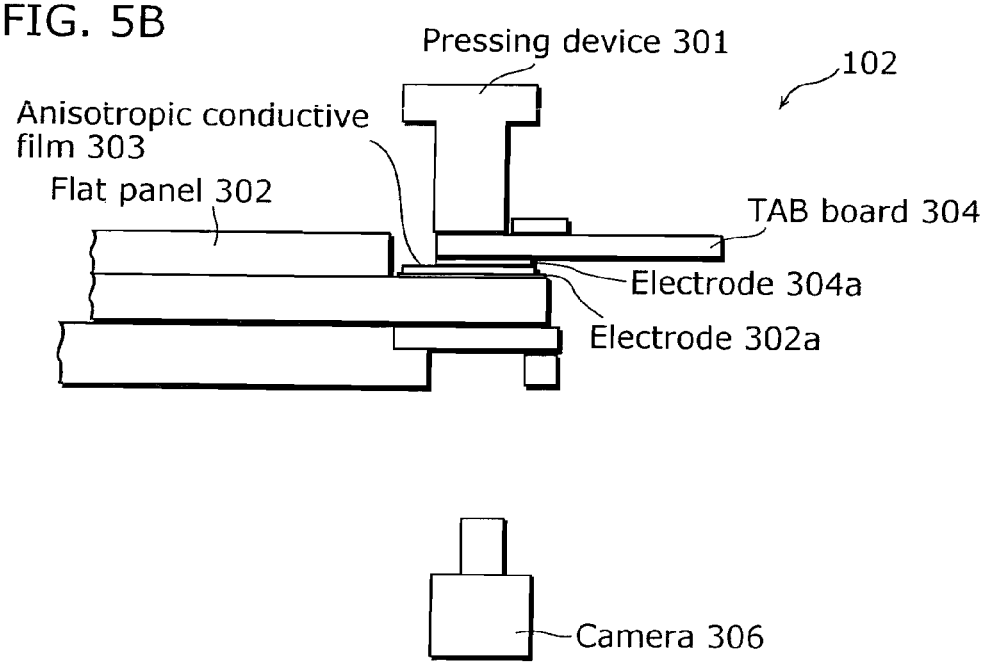

FIGS. 5A and 5B are reference diagrams describing an operation of the preliminary press bonding device 102 shown in FIG. 3.

FIG. 5A shows a positional relationship in each process before matching and preliminary press bonding, to an edge portion of the flat panel 302, a TAB board 304 which is a component.

The flat panel 302 is fixed, and by sliding the position determining 305 to a predetermined direction indicated by an arrow, the electrode 304a on the TAB board 304 is moved to the electrode 302a on the flat panel 302. In addition, as shown in FIG. 5B, the position of the electrode 304a on the TAB board 304 is matched with the position of the electrode 302a on the flat panel 302 using a pressing device 301, and the preliminary press bonding is performed via the anisotropic conductive film 303.

Furthermore, in the preliminary press bonding process, when the TAB board 304 is precisely positioned on the flat panel 302, the camera 306 recognizes the recognition mark on the flat panel 302, and the camera 307 recognizes the recognition mark on the TAB board 304 so that the position of the TAB board 304 can be precisely matched with the position of the flat panel 302.

Note that there is a method of matching the width of the electrode 302a on the flat panel 302 with the width of the electrode 304a on the component 304. However, in order to increase the tolerance of the position displacement, in general, either of the sizes is made slightly larger. The first embodiment is described, assuming that the width of the electrode 302a on the flat panel 302 is larger than the width of the electrode 304a on the component 304.

Figure 6:
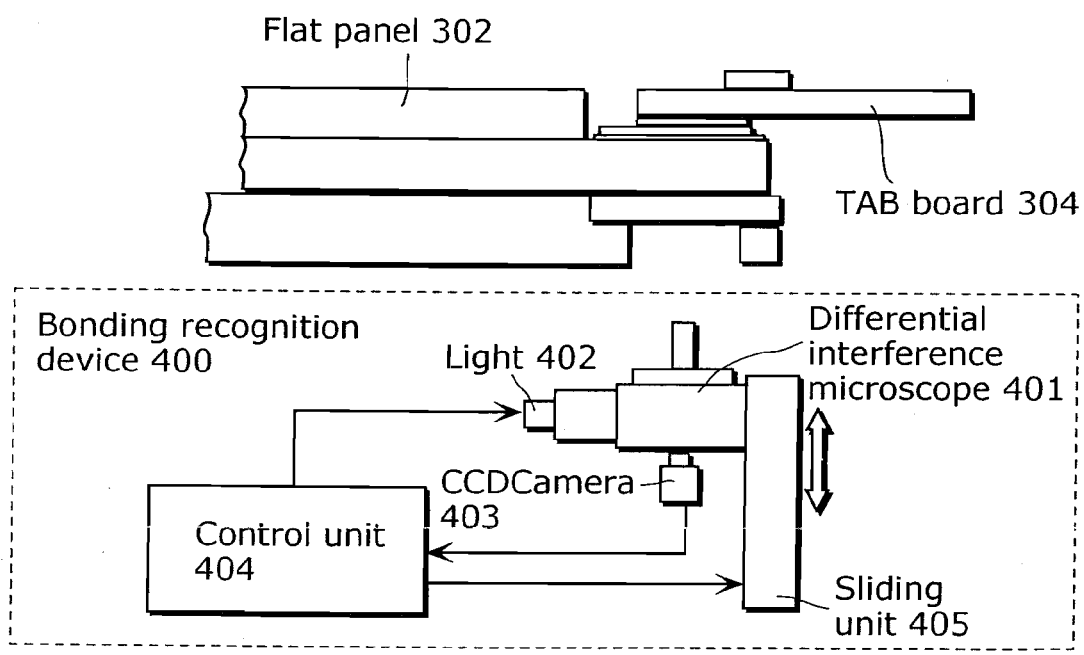
FIG. 6 is a diagram describing a bonding recognition device provided in a press bonding device.

FIG. 6 is a diagram describing a bonding recognition device 400 provided in the press bonding device 103.

The bonding recognition device 400 includes: a differential interference microscope 401 which detects a position data group of indentations of conductive particles; a light 402 for use in capturing an image; a CCD camera 403 which detects a bonding state; a control unit 404 which controls each processing unit; and a sliding unit 405 for adjusting a focus of the differential interference microscope 401.

The operation of this bonding recognition device 400 is described as follows.

First, the control unit 404 moves to an electrode on the TAB board 304 to be recognized, the light 402 is turned on, and the bonding state is retrieved by the CCD camera 403. With this, the position displacement amount of bonding between the electrode on the flat panel and the electrode on the TAB board 304 can be recognized.

Furthermore, the bonding recognition device 400 recognizes the electrodes on the TAB board 304. However, when the number of the components to be recognized is too many and such components stand out of the range of the bonding recognition device 400, it becomes possible to recognize the electrodes by providing a sliding unit which slides forward and backward. Note that the present diagram describes only a case where the bonding recognition device 400 has only the sliding unit 405 which slides upward and downward.

Furthermore, when a position displacement amount is calculated using a recognition mark, instead of the bonding recognition device 400 including the differential interference microscope 401 shown in the present diagram, the camera 306 for use in the preliminary press bonding device 102 of FIGS. 5A and 5B is used, which does not require a precise enlargement ratio.

Figure 7:
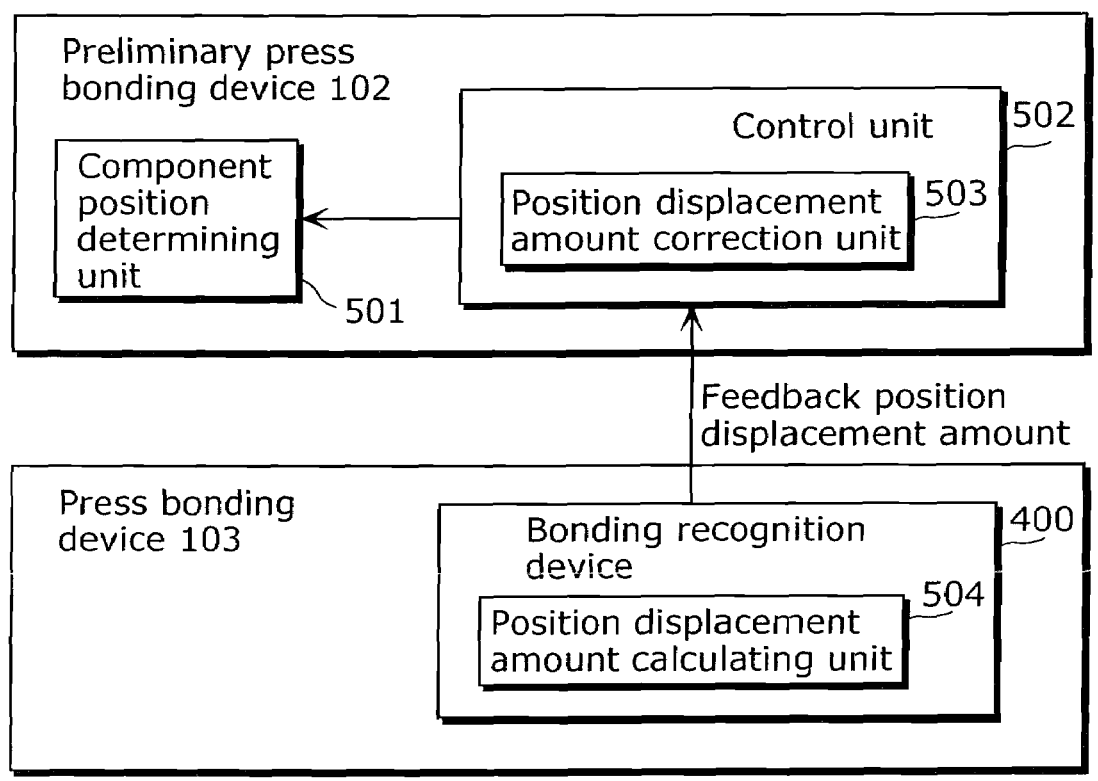
FIG. 7 is a functional block diagram of the preliminary press bonding device and the press bonding device according to the first embodiment.

FIG. 7 is a functional block diagram of the preliminary press bonding device 102 and the press bonding device 103 according to the first embodiment.

The preliminary press bonding device 102 includes: a control unit 502 which includes a position displacement amount correction unit 503 to which the position displacement amount after the press bonding process is fed back and which corrects the position displacement on the next component to be bonded; and the component position determining unit 501 which determines a position of the component using the fed back correction amount.

The press bonding device 103 includes the bonding recognition device 400 for use in the recognition of the position of the electrode on the flat panel and the position of the electrode of the component as shown in FIG. 6, and also includes a position displacement amount calculating unit 504 which calculates a position displacement amount based on the recognized position information.

As shown in the present diagram, the position displacement amount is corrected based on the position displacement amount which has been calculated between the electrode on the flat panel and the electrode of the component after the press bonding process and which has been transmitted from the bonding recognition device 400 to the control unit 502 of the preliminary press bonding device 102. Then, the result is transmitted to the component position determining unit 501, and the preliminary press bonding device 102 determines a position of the electrode of the component on the electrode on the flat panel. Then, the preliminary press bonding process is performed between the electrodes using the pressing device 301. Note that although the bonding recognition device 400 has been installed in the press bonding device 103, it may be provided separately from the press bonding device 103.

Note that it is possible to conceive a method of correcting a position displacement amount in which: the position displacement amount is calculated based on the recognition marks using the control unit 502 of the preliminary press bonding device 102; and the position displacement amount is corrected based on the calculated amount, and the position displacement amount which has been recognized between the electrode on the flat panel and the electrode of the component after the press bonding process and which has been transmitted from the bonding recognition device 400 to the control unit 502 of the preliminary press bonding device 102.

FIGS. 9A and 9B are diagrams describing a position displacement amount calculation method as a component bonding method according to the first embodiment.

Note that in the present diagram, it is described that the position displacement amount is calculated using a bonding state of one of the bonded electrodes.

As shown in FIG. 9A, the bonding recognition device 400 recognizes indentations of the conductive particles in the anisotropic conductive film, and a center value of the shape of the particles is obtained.

The reference position data is obtained on an X-Y plane. In the present diagram, it is assumed that the X axis is along the direction of a shorter side of the flat panel, and the coordinate of the center position of the electrode 702 selected by the flat panel which is on the X axis is Xa. Furthermore, the same processing is performed on the Y axis.

Then, each position data of indentations of the conductive particles detected by the bonding recognition device 400 is assumed to be the coordinates, such as $F1=(X1, Y1), \ldots, Fn=(Xn, Yn)$, and based on such data, the optimal linear approximation is obtained by calculation. In the present invention, the optimal linear approximation at each position of the indentations is obtained using the least squares method. Note that letting $Y=aX+b$ as this linear approximation, "a" and "b" can be obtained by the following Equation 1.

$$Xav = 1/n * \Sigma Xi$$

$$Yav = 1/n * \Sigma Yi$$

$$\sigma xx = 1/n * \Sigma (Xi-Xav)^2$$

$$\sigma xy = 1/n * \Sigma (Xi-Xav)(Yi-Yav)$$

$$a = \sigma xy/\sigma xx$$

$$b = Yav - a*Xav \qquad \text{[Equation 1]}$$

Here, Xav is the average value of Xi, Yav is the average value of Yi, σxx is the variance of Xi, and σxy is the common variance for Xi and Yi.

While the linear approximation obtained in FIG. 9A is $Y=a1X+b1$, the linear approximation obtained in FIG. 9B is $Y=a2X+b2$.

Next, according to FIG. 9B, the obtained linear approximation is $Y=a2X+b2$, and the X coordinates, X0 and X1 are obtained by the following Equation 2, when the Y coordinates are 0 and Y1.

$$X0 = -b2/a2$$

$$X1 = (Y1-b2)/a2 \qquad \text{[Equation 2]}$$

With this, the center position Xb of the electrode 703 of the component with respect to the center position Xa of the electrode 704 on the flat panel can be obtained by the following Equation 3.

$$Xb = (X1-X0)/2 \qquad \text{[Equation 3]}$$

The slope θb of the line can be obtained by the following Equation 4.

$$\theta b = \text{ARC Tan}(a2) \qquad \text{[Equation 4]}$$

Thus, the coordinates ($\Delta X$, $\Delta Y$, $\Delta \theta$) that are correction position data to be corrected can be respectively obtained from the positive directions of the X and Y axes, and anti-clockwise from the θ axis using the following Equation 5.

$$\Delta X = Xa - X1$$

$$\Delta Y = 0$$

$$\Delta \theta = 90° - \theta b \qquad \text{[Equation 5]}$$

Note that although the correction position data can be obtained by the Y coordinates of 0 and Y1 in the first embodiment, when the correction need to be carried out in respect to the relationship in positions of electrodes relative to the reference position, predetermined correction data may be added into each of the correction data $\Delta X$ and $\Delta Y$.

Figure 10:
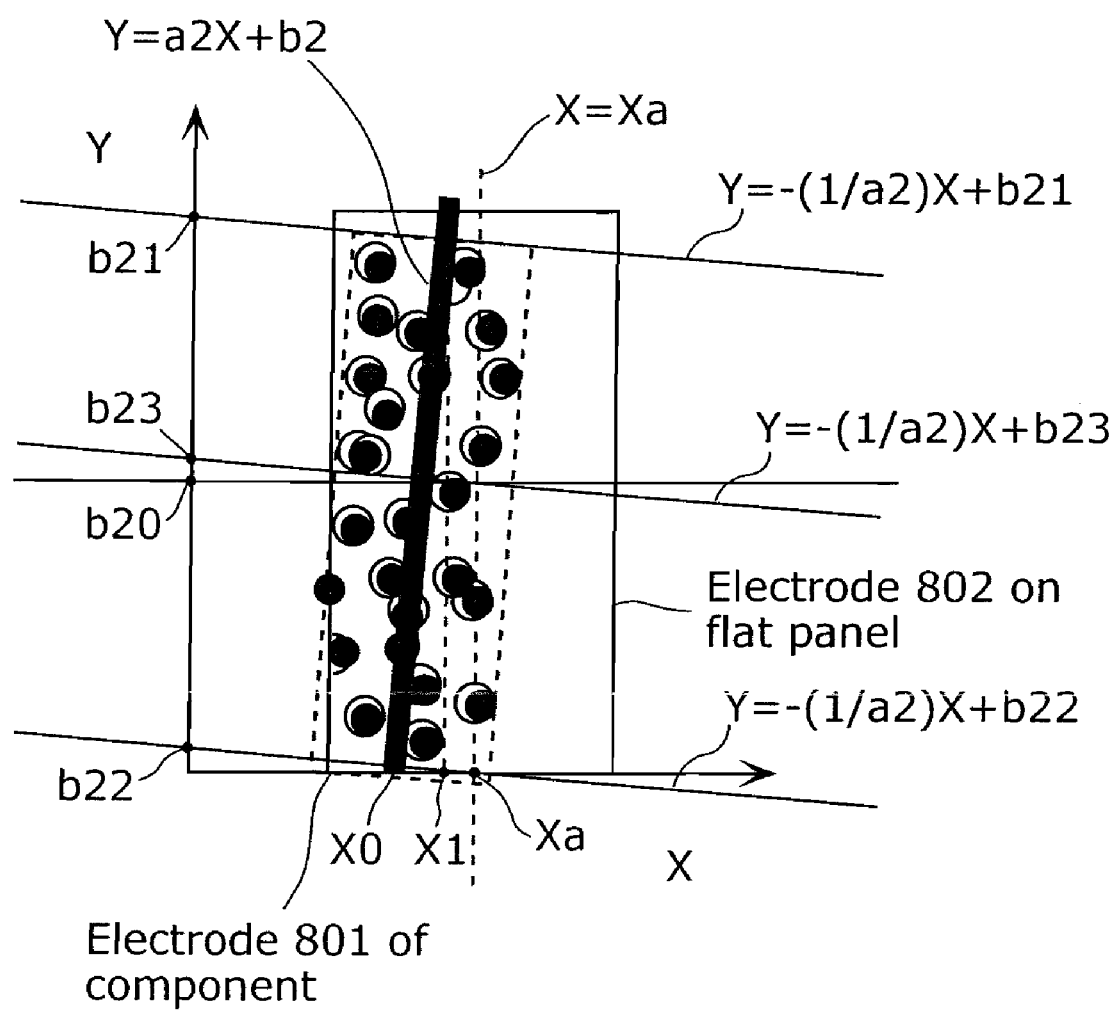
FIG. 10 is a diagram describing a position displacement amount calculation method for use in the component bonding method according to the first embodiment.

FIG. 10 is a diagram describing another position displacement amount calculation method for use in a component bonding method according to the first embodiment. Note that although $\Delta Y$, which is the displacement amount in the Y axis, is not obtained in the calculation of the position displacement amount in FIGS. 9A and 9B, the correction amount $\Delta Y$ in the Y axis direction can be obtained in the present diagram.

First, the line to the length direction of an obtained electrode 801 is expressed by an equation Y=a2X+b2, and a line orthogonal to the line is obtained by the following Equation 6.

$$Y=-(1/a2)X+b22 \quad \text{[Equation 6]}$$

Using this line equation, in order to find ranges of the lines covering each position data, F1=(X1, Y1) . . . Fn=(Xn, Yn), the following two line equations shown in Equation 7 are obtained.

$$Y=-(1/a2)X+b21$$

$$Y=-(1/a2)X+b22 \quad \text{[Equation 7]}$$

ΔY can be obtained with these b21 and b22. More specifically, ΔY can be obtained by the following steps: calculating b23=(b21+b22)/2; and comparing the solution with the reference value corresponding to b20 in which the electrode 802 on the flat panel and the electrode 801 of the component overlap. With this, all of the correction position data for the adjacent values along the Y axis can be obtained.

Figure 13A:
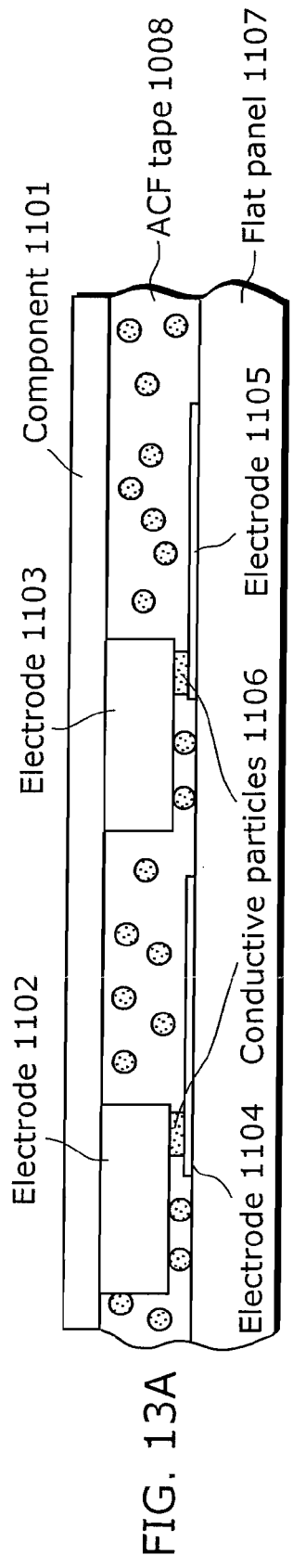
FIGS. 13A and 13B are sectional views describing a relationship between electrodes formed on a component and indentations of conductive particles included in an ACF tape.
Figure 13B:
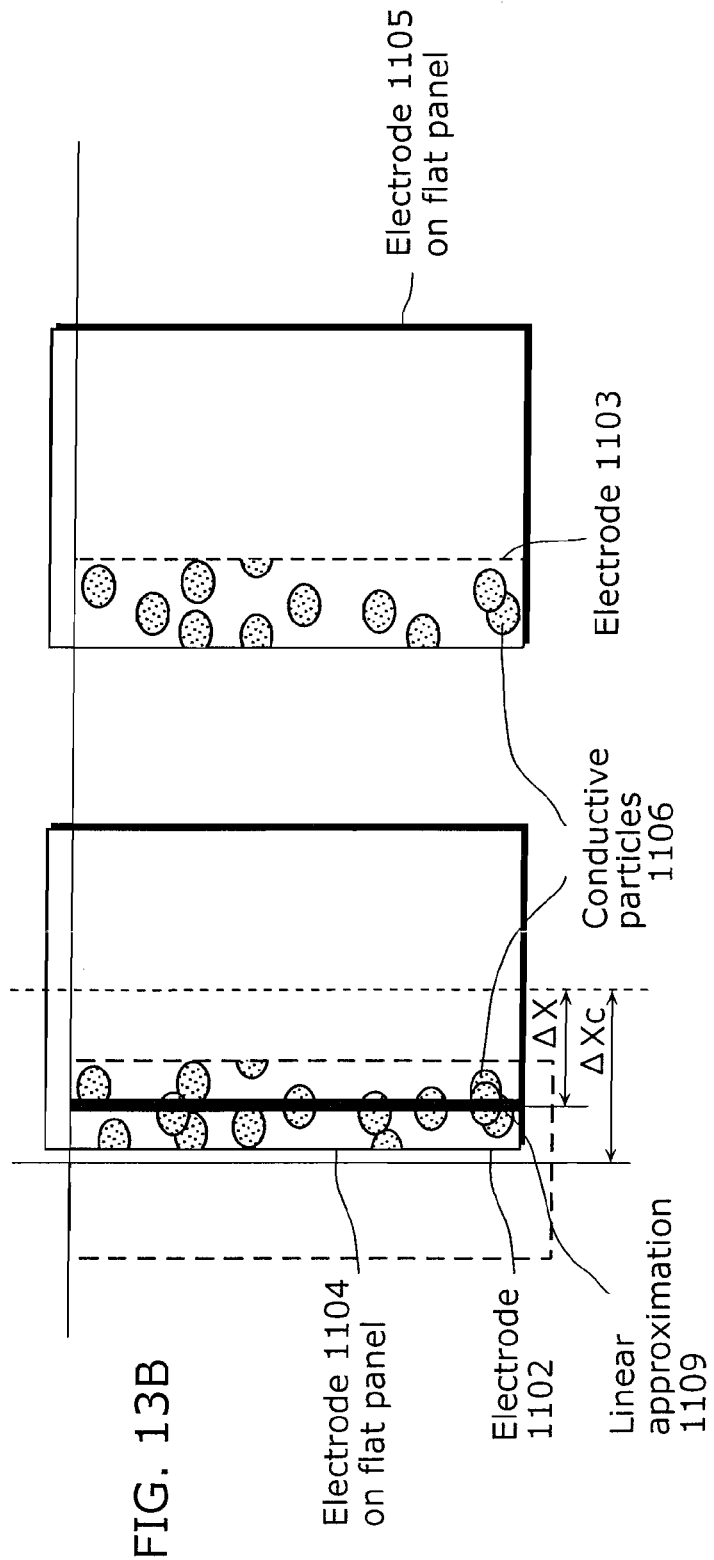

Note that the problem in the component bonding method according to the first embodiment is that when the area where the electrode 1102 of the component and the electrode 1104 on the flat panel overlap one another is small as shown in FIGS. 13A and 13B, the displacement amount ΔX becomes smaller than ΔXc which indicates the distance to the center position of the electrode of the component to be actually bonded.

However, even in the case shown in FIGS. 13A and 13B, by gradually performing the correction, the precision of the bonding is being improved, and as a result, the electrode of the component is bonded closer to the center position of the electrode on the flat panel.

Note that since in the actual bonding recognition process, the positions of the recognized indentations need to be positioned within the electrode on the flat panel, the recognition result may be filtered within the area range of the electrode on the flat panel. As a result, the noise generated in a portion other than the flat panel can be eliminated, and thus, more precise recognition result can be obtained.

FIGS. 11A and 11B are sectional views describing a relationship between electrodes 902 and 903 formed on a component 901 and the indentations of conductive particles 906 included in an ACF tape 908.

The present diagram shows the position displacement of the electrodes 902 and 903 on the component 901 with respect to electrodes on the flat panel 907 in the Y and X axis directions. By obtaining the position data group of occurring indentations of the conductive particles 906, using the bonding recognition device, the linear approximation 909 is obtained, and the position displacement amounts with respect to electrodes 904 and 905 on a flat panel 907 are calculated.

FIGS. 12A and 12B sectional views describing a relationship between electrodes 1002 and 1003 formed on a component 1001 and the indentations of conductive particles 1006 included in an ACF tape 1008.

The present diagram shows the position displacement of electrodes 1002 and 1003 on a component 1001 with respect to electrodes on a flat panel 1007 in the Y and X axis directions and in a θ direction. A linear approximation 1009 is obtained from the position data group of occurring indentations of the conductive particles 1006 which is obtained by the bonding recognition device, and the position displacement amounts with respect to electrodes 1004 and 1005 on a flat panel 1007 are calculated.

As described above, in the component bonding method according to the first embodiment, the bonding recognition device 400: includes a differential interference microscope 401 that extracts a bonding state between the electrode on the flat panel and the electrode of the component after the press bonding process; calculates the position displacement amount based on the recognized image; and feeds back the position displacement amount to the preliminary press bonding process as a correction amount.

Thus, since the position displacement amount after the actual press bonding process can be calculated, it is possible to eliminate a factor of causing bonding position displacement occurred during the period from the preliminary press bonding process to the press bonding process, and to bond components on flat panels with reliability higher than the conventional case.

Furthermore, in order to calculate a position displacement amount, a difference between a recognition mark formed on a component and a recognition mark formed on a flat panel is used as the position displacement amount. Besides that, the position displacement amount can be obtained by recognizing the position data group of the indentations of the conductive particles contained in the ACF tape and calculating the linear approximation using the data group. Therefore, the position displacement amount can be calculated using a method other than a method of using the recognition marks.

Second Embodiment

Next, the component bonding method according to the second embodiment of the present invention is described with reference to the diagrams. Note that the component bonding method according to the second embodiment is to find a shape matching the shape of the component from the data group of recognized positions of indentations of conductive particles formed on the flat panel after the press bonding process and to calculate the position correction amount based on the matching data.

Figure 14:
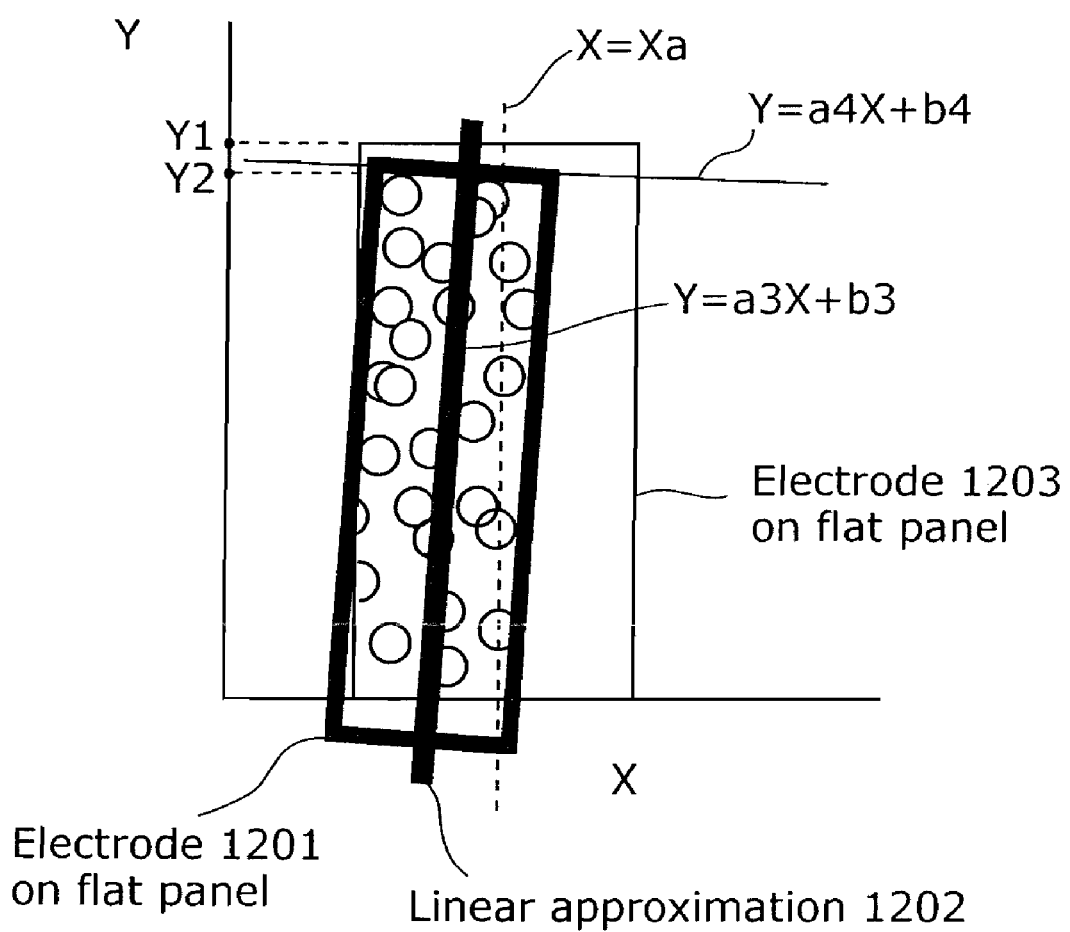
FIG. 14 is a diagram describing a position displacement amount calculation method for use in a component bonding method according to the second embodiment.

FIG. 14 is a diagram describing a position displacement amount calculation method as a component bonding method according to the second embodiment.

In the second embodiment, based on the position data group of the indentations occurring from bonding and the template data of a reference shape of one of electrodes of the component to be provided, a template position which allows the position data with the highest number of the indentations is recognized as a position of an electrode 1201 of the component.

Note that since this template matching method is a general method, the details are not described herein. In the present method, a position which allows the position data group with the highest number of indentations within the template is determined by sliding the template on the coordinates.

Then, letting Y=a3X+b3 as the linear approximation 1202 obtained from the finally determined shape, the correction position data (ΔX, ΔY, and Δθ) obtained from the same calculation method as the position correction method according to the first embodiment is obtained.

Furthermore, the difference between the first and second embodiments is that in the second embodiment, the equation of the shorter line of the component 1201 is obtained by Y=a4X+b4, and the Y coordinate of a point of intersection of the line Y=a4X+b4 and the equation Y=a3X+b3 is obtained. Assuming that the value is "Y2", the correction position data ΔY to be corrected on the Y axis can be obtained by the difference between "Y1", which is the reference Y axis data of the shorter line of the component 1201, and the intersection data "Y2".

Furthermore, although in the second embodiment, depending on at which position the electrode 1201 of the component is bonded on the electrode 1203 of the flat panel, the matching position is displaced to the right or left. However, with the template matching, even when the matching position is displaced, since it is possible to detect the line where the component is bonded, the position of the electrode 1201 of the component can be recognized.

Figure 15:
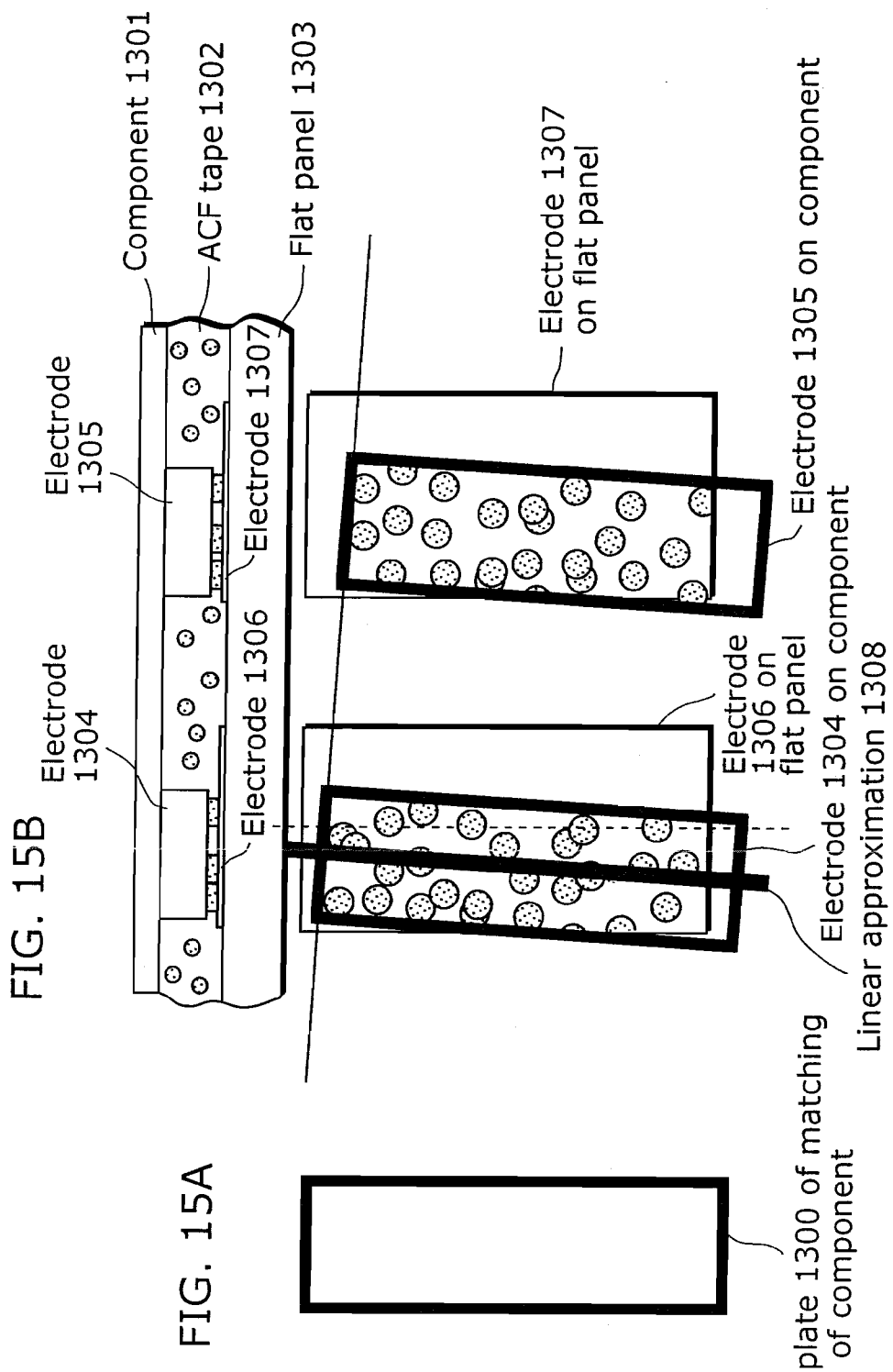
FIGS. 15A and 15B are diagrams, according to the second embodiment, describing a relationship among a template of matching data of the component, electrodes formed on the component, the indentations of the conductive particles included in the ACF tape.

FIGS. 15A and 15B are diagrams according to the second embodiment describing a relationship among a template 1300 of the matching data of the component, electrodes 1304 and 1305 formed on the component 1301, and the indentations of the conductive particles included in an ACF tape 1302.

Using the template 1300 of the matching data of the component shown in FIG. 15A, it becomes possible to recognize the position of the electrode 1304 of the component based on the position data group of the indentations shown in FIG. 15B, and to calculate the position displacement amount with an electrode 1306 on the flat panel, using a linear approximation 1308.

Figure 16:
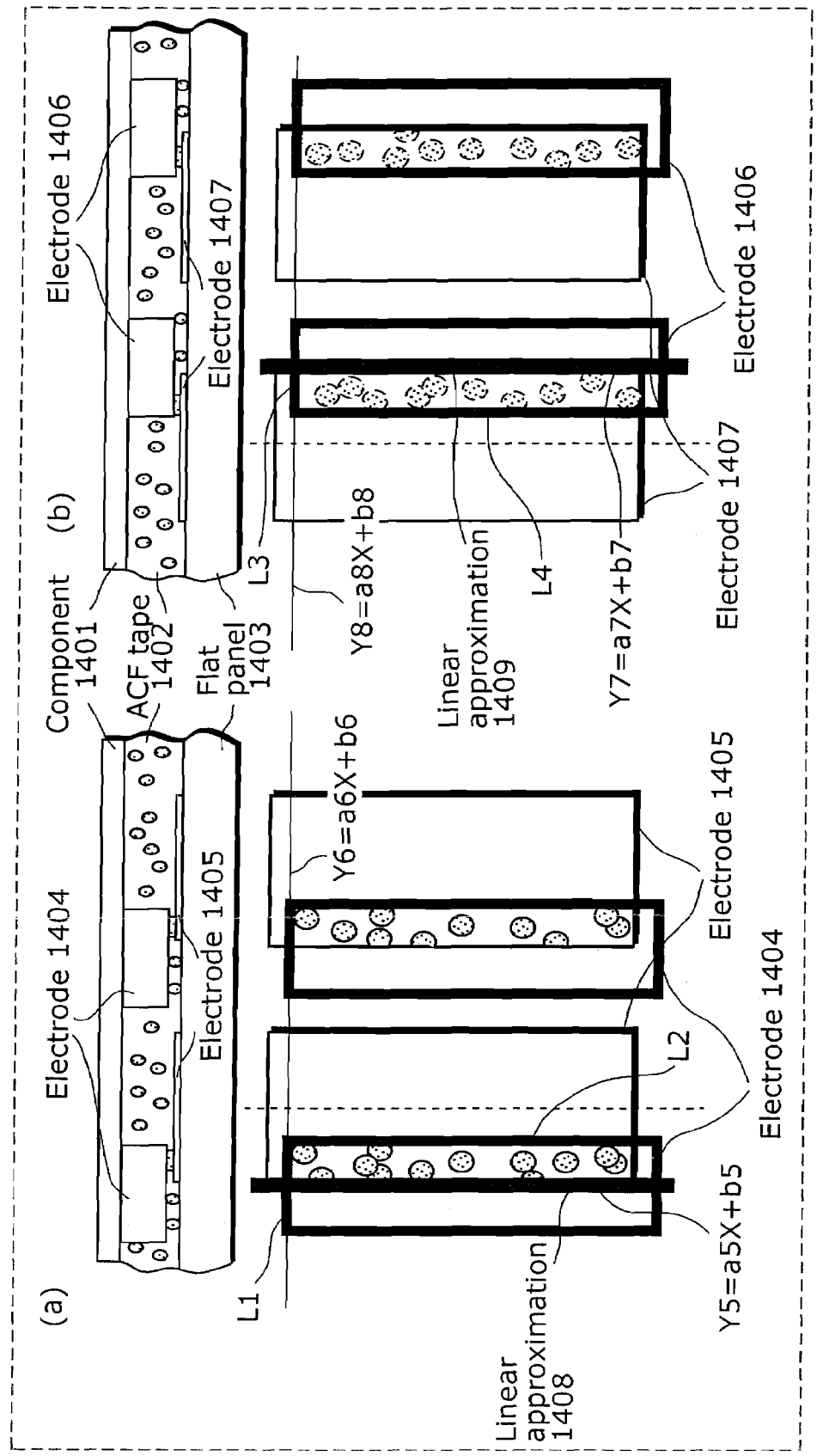
FIG. 16 is a diagram describing a position displacement amount calculation method for use in a component bonding method according to the second embodiment.

FIGS. 16A and 16B are diagrams describing a position displacement amount calculation method for use in a component bonding method according to the second embodiment.

In FIG. 16A, the linear approximations of Y5 and Y6 are obtained based on a right side L2 and an upper side L1 of an electrode 1404 of the component.

Furthermore, the linear approximations of Y7 and Y8 are obtained based on a right side L4 and an upper side L3 of an electrode 1406 of the component. Thus, using these linear approximations, it is possible to obtain the correction position data ($\Delta X$, $\Delta Y$, and $\Delta \theta$).

As described above, with the component bonding method according to the second embodiment, it is possible to calculate the position displacement amount using the template of the matching data of the component and the position data group of the indentations of the conductive particles after the press bonding process, and to feed back this position displacement amount to the preliminary press bonding process as the correction amount. For example, even when a significant displacement occurs at the bonded position of the component, it is possible to more precisely calculate the position displacement amount.

Third Embodiment

Next, the component bonding method according to the third embodiment of the present invention is described with reference to the diagrams.

Note that when an electrode of a component is bonded to an electrode on a flat panel via an anisotropic conductive film, there are cases where it is difficult to recognize whether or not conductive particles are crushed with the pressing force. Thus, in the component bonding method according to the third embodiment, using a bonding recognition device, an area where the electrode of is the flat panel and the electrode of the component overlap is detected, and the correction data ($\Delta X$, $\Delta Y$, and $\Delta \theta$) for correction is obtained based on the position data of the shape of the indentations.

More specifically, after the press bonding process, the shape of the indentations of the conductive particles occurring when pressing the component on the flat panel is recognized using a filter for noise elimination provided depending on the directions, and based on the shape of the shape, the correction amount is calculated.

As the detection methods of this shape, although a special detection method is used after recognizing the shape by the bonding recognition device, it is conceivable to use an edge filter so as to recognize an edge portion as one of the detection methods. Although various methods of edge detection filters are disclosed, in the present invention, an edge portion is obtained using "Prewitt operator" which is a determinant.

Figures 17A, 17B:
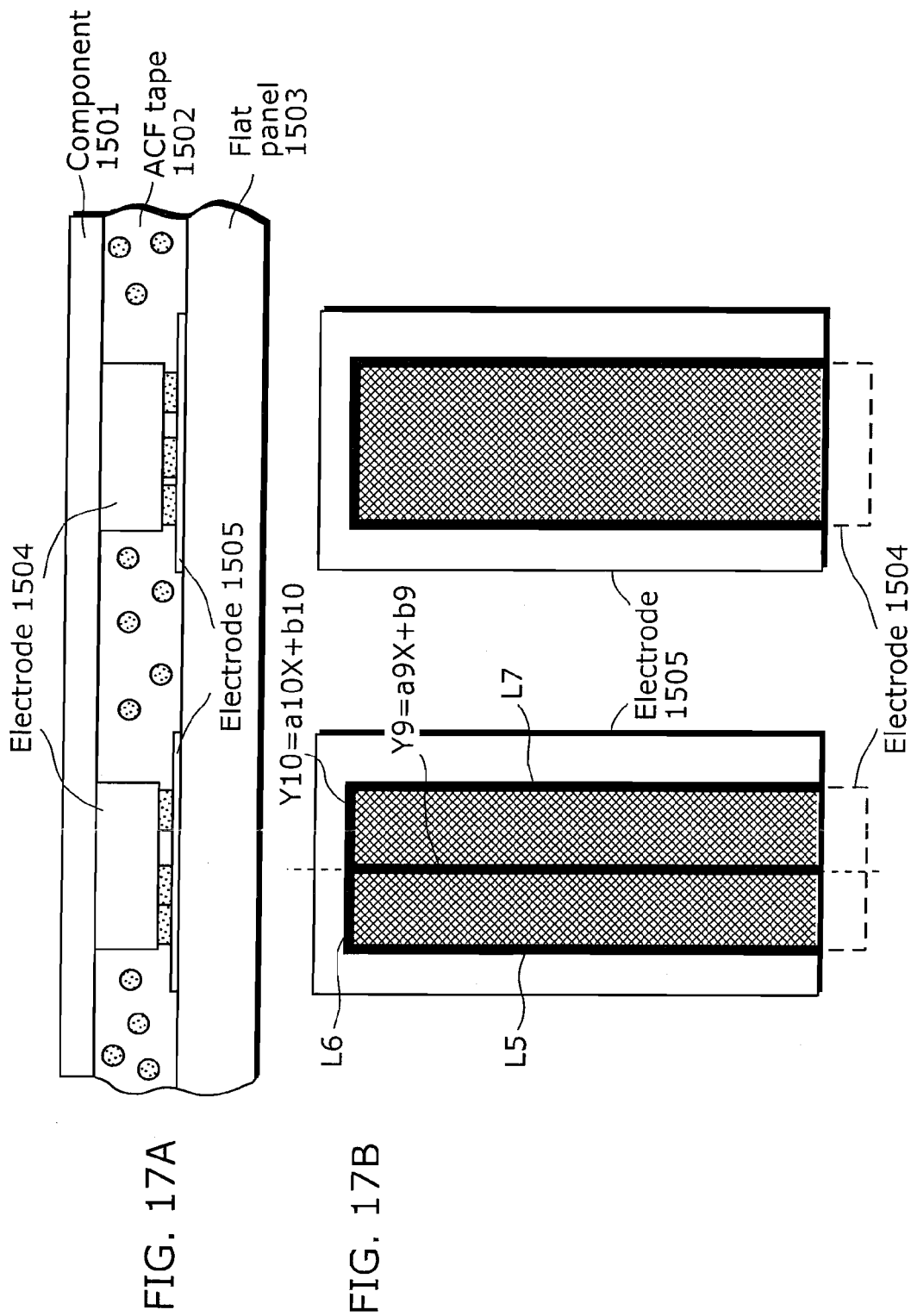
FIGS. 17A and 17B are diagrams describing edge detection for use in the component bonding method according to the third embodiment.

FIGS. 17A and 17B are diagrams describing edge detection for use in the component bonding method according to the third embodiment.

Using the bonding recognition device, L5, L6, and L7 which are the edges of the shape of the electrode 1504 of the component are detected, and the position displacement amount is calculated from the positions of the detected edges.

Note that the method of calculating the position displacement amount by a linear approximation (Y9=a9X+b9 and Y10=a10X+b10 in the present diagram) is the same as the one used in the aforementioned embodiments. Thus, the description is omitted.

Figures 18A, 18B:
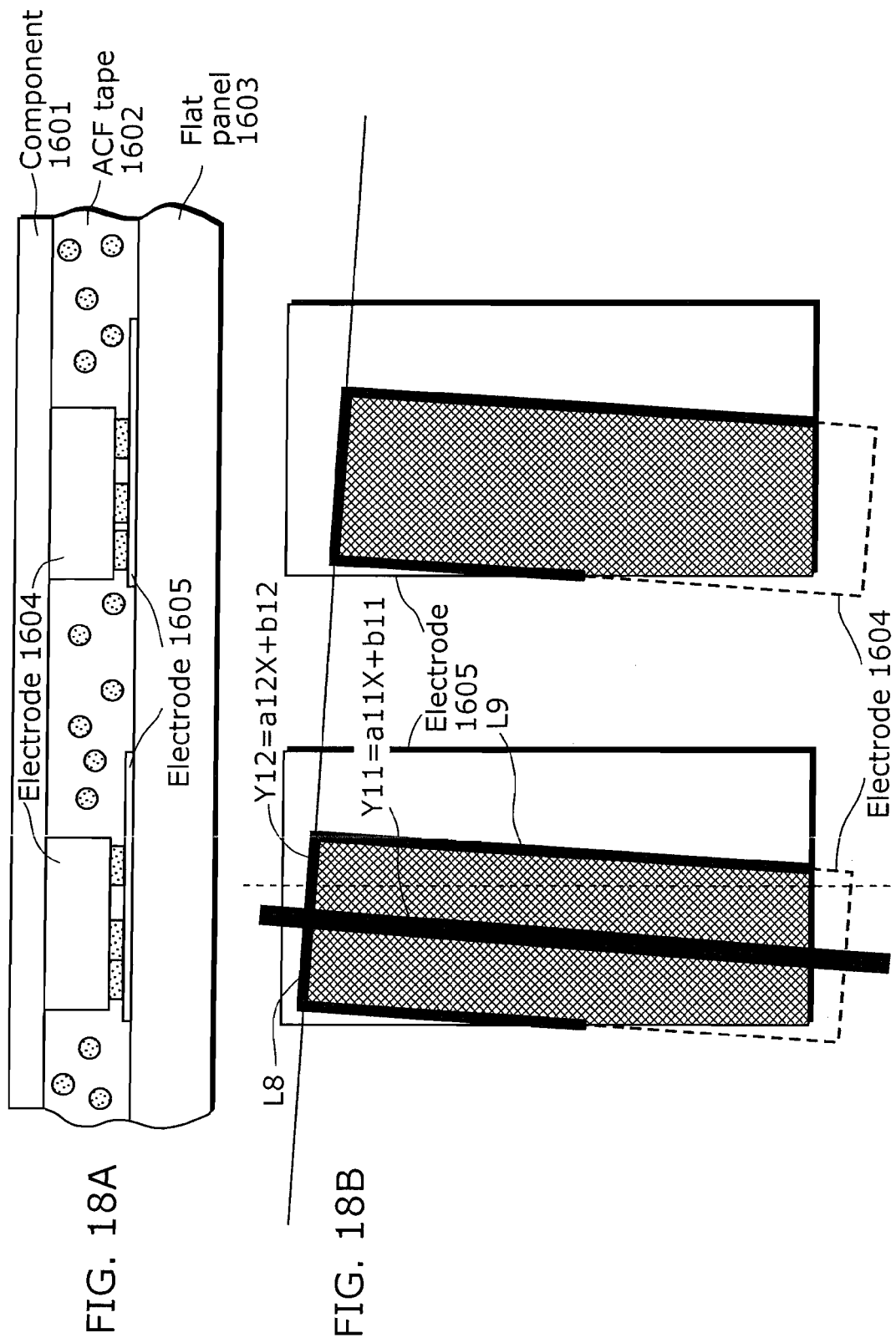
FIGS. 18A and 18B are diagrams describing edge detection for use in the component bonding method according to the third embodiment.

FIGS. 18A and 18B are diagrams describing edge detection for use in the component bonding method according to the third embodiment.

Using the bonding recognition device, L8 and L9 which are the edges of the shape 1604 of the electrode of the component are detected. Then, the linear approximations Y11 and Y12 are calculated from the positions of detected edges, and the correction position data ($\Delta X$, $\Delta Y$, and $\Delta \theta$) which is the position displacement amount between the electrode of the component and the electrode on the flat panel is obtained.

FIGS. 19A and 19B are diagrams describing edge detection for use in the component bonding method according to the third embodiment.

Using the bonding recognition device, L10 and L11 which are the edges on the shape 1704 of the electrode of the component are detected. Then, the linear approximations Y13 and Y14 are calculated from the positions of the detected edges, and the correction position data ($\Delta X$, $\Delta Y$, and $\Delta \theta$) which is the position displacement amount between the electrode of the component and the electrode on the flat panel is obtained.

As described above, in the component bonding method according to the third embodiment, in the case where the electrode of the component is bonded to the electrode on the flat panel via anisotropic conductive film, even when it is difficult to recognize whether or not the conductive particles are crushed with the pressing force, it is possible to appropriately detect edges on the bonded portion, and to calculate the position displacement amount so that the amount is fed back as the correction amount in the preliminary press bonding process. Thus, it is possible to achieve higher bonding precision.

Fourth Embodiment

Next, the component bonding method according to the fourth embodiment of the present invention is described with reference to the diagrams. Note that in the component bonding method according to the fourth embodiment, the position is corrected by selecting one of electrodes near the center of the component and calculating the position displacement amount.

Figure 20:
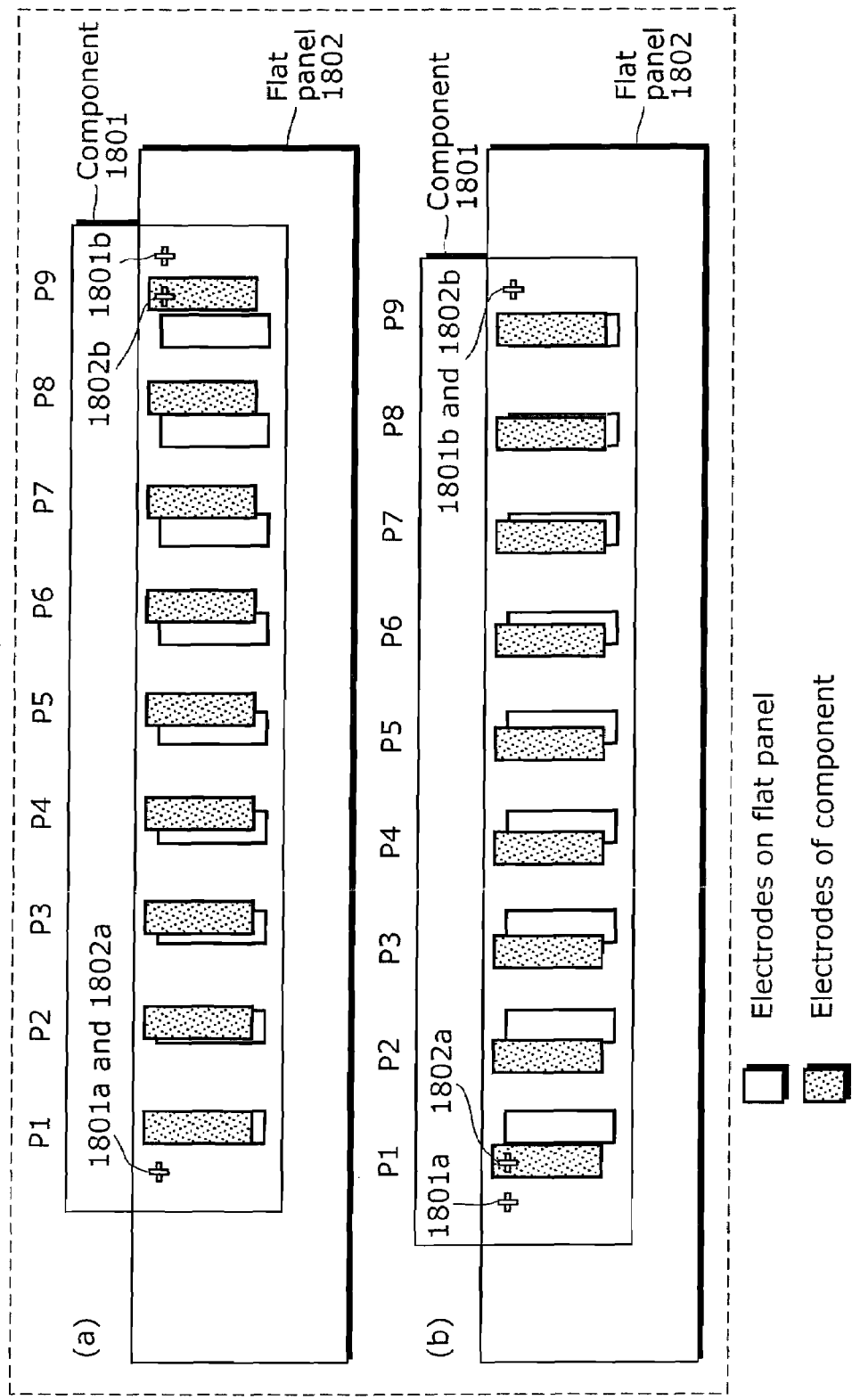
FIG. 20 is a diagram describing a position correction method using the recognition marks according to the conventional component bonding method.

FIG. 20 is a diagram describing a position correction method using the recognition marks according to the conventional component bonding method.

In the present diagram, when the electrodes on the flat panel are matched with the electrodes of the component, the bonding is performed by matching the recognition marks on the flat panel and on the component, and besides that, this diagram is the reference diagram when the electrodes of the component are extended.

Conventionally, two recognition marks (1802a and 1802b) are formed on a flat panel 1802 so as to match a position of a component 1801 with a position of the flat panel 1802, and the corresponding recognition marks (1801a and 1801b) are also formed on the component 1801. By matching the positions using these recognition marks, the position displacement amount is adjusted and the displacement between the electrodes are eliminated.

However, there are cases where the distance between the electrodes of the component 1801 may vary due to factors, such as the heating process in press bonding and the environment in the pressing process. In such cases, as shown in FIGS. 20A and 20B, even when the positions are matched using either of the left recognition mark 1801a or the right recognition mark 1801b, a problem arises that a position displacement significantly occurs in the other side of edges and position displacement occurs in bonding the electrode of the component to the electrode on the flat panel. As described above, even when the position displacement amount between the two recognition marks is calculated and adjusted, there is a problem that the state in which the component has been actually bonded can not be recognized.

Note that although there is a method of offsetting the difference between the two recognition marks, a problem arises that the actual bonding state is not reflected.

Figure 21:
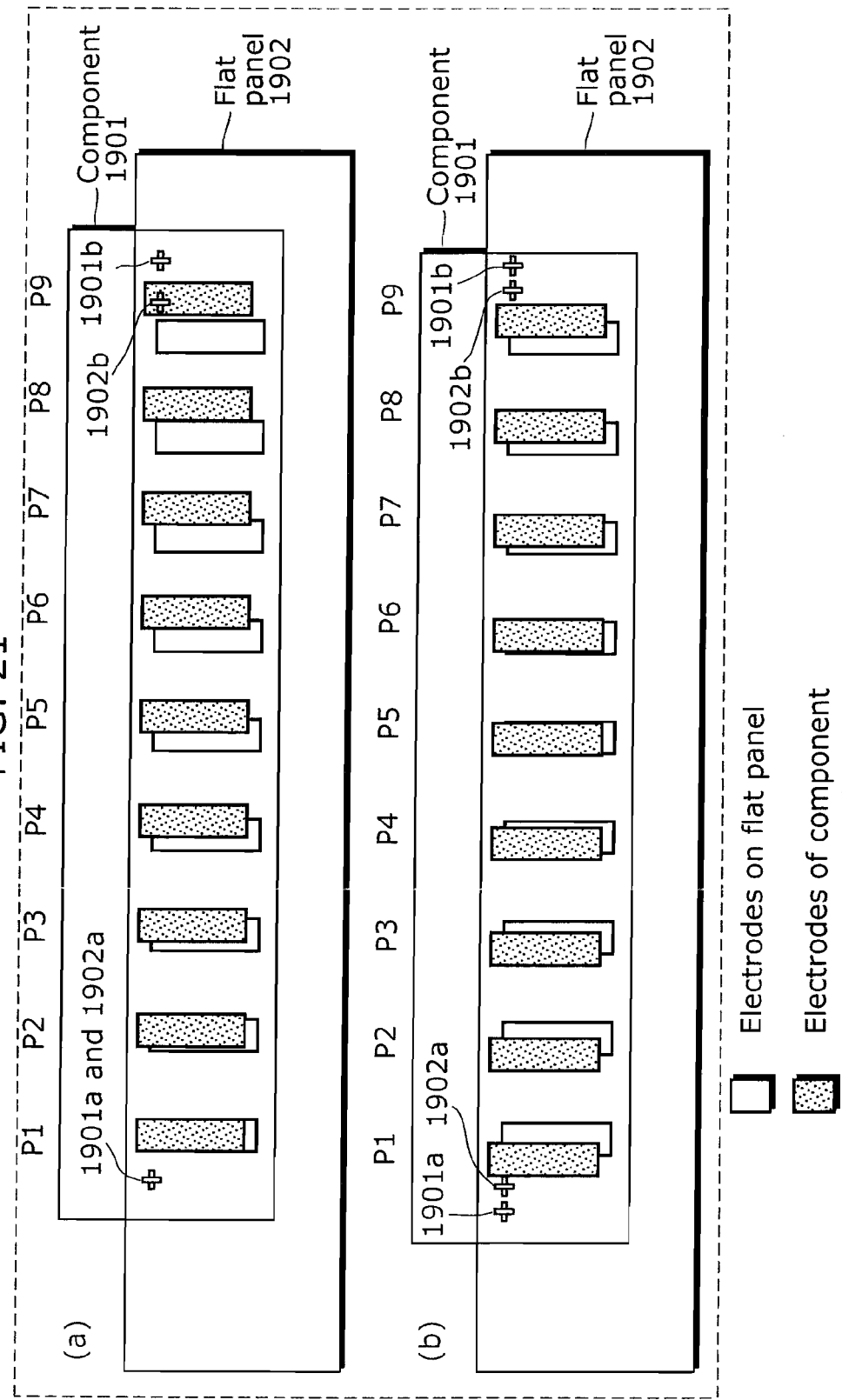
FIG. 21 is a diagram describing a position correction method for use in the component bonding method according to the fourth embodiment.

FIG. 21 is a diagram describing a position correction method for use in the recognition marks according to the fourth embodiment.

In the position correction method according to the present invention, when there are plural electrodes 1901, an electrode to be an object for calculating the position displacement amount is assume to be the electrode near the center of the component 1901.

As shown in FIG. 21(a), when the position of the component 1901 is matched with the position of the flat panel 1902 using the left side of the recognition marks (1901a and 1902a), the positions at the electrode portion P9 can not be matched.

Thus, in the present invention, as shown in FIG. 21(b), after matching the recognition marks (1901a and 1902b), the displacement between the electrodes which has occurred in the prior bonding process at the electrode portion P5 is added as the correction data, and the bonding is performed.

With this, it becomes possible to use, in the bonding process, the displacement amount which occurs in the latest bonding process, and even when the pitch between the electrodes varies in the pressing process and heating process, it is possible to reduce the occurrence of the defective bonding between the electrodes. Note that when the number of the electrodes is odd, the displacement amount at the center electrode can be used as correction data, and when the number is even, the displacement amount of either of the electrodes at the center can be used.

Thus, as shown in FIG. 21(a), even when the positions of the electrodes at P9 can not match, using the position correction method according to the fourth embodiment, the positions of the electrodes at P5 precisely match as shown in FIG. 21(b), and approximately half of the positions of the electrodes on the flat panel 1902 and the component 1901 can match one another at P1 and P9.

As described above, in the component bonding method according to the fourth embodiment, it is possible to obtain a bonding result with higher reliability by using, in the preliminary press bonding process, the displacement amount calculated in a bonding state of the electrode which is positioned "near the center of the electrodes" of the component even when the width between the electrodes of the component and on the flat panel varies due to the pressing process and heating process. Thus, it becomes possible to achieve, with the position displacement correction, robust feedback control which is less subject to disturbance.

(Case where Either of the Electrodes is Selected)

Note that although the portion where the position displacement amount is recognized is near the center of the electrodes in the fourth embodiment, the portion is not limited to this, and it is possible to correct the position by recognizing the position displacement amount of one of the electrodes.

Furthermore, it is conceivable that the position displacement amount is calculated from plural electrodes, and the average is calculated so as to use it in the correction position data ($\Delta X$, $\Delta Y$, and $\Delta \theta$).

For example, assuming that the position displacement amounts at the two portions are expressed by ($\Delta X1$, $\Delta Y1$, and $\Delta \theta 1$) and ($\Delta X2$, $\Delta Y2$, and $\Delta \theta 2$), the correction position data ($\Delta X$, $\Delta Y$, and $\Delta \theta$) at the time can be calculated based on the average value of the position displacement amount between the two portions, using the following Equation 8.

$$(\Delta X, \Delta Y, \text{ and } \Delta\theta) = ((\Delta X1 + \Delta X2)/2, (\Delta Y1 + \Delta Y2)/2, (\Delta\theta 1 + \Delta\theta 2)/2) \quad \text{[Equation 8]}$$

As described above, since the average value of the position displacement amount is calculated based on the bonding states of plural electrodes, correction position data ($\Delta X$, $\Delta Y$, and $\Delta \theta$) to be corrected becomes more precise value which can make the reliability of the bonding higher.

Fifth Embodiment

Next, the component bonding method according to the fifth embodiment of the present invention is described with reference to the diagrams. Note that the fifth embodiment describes a position correction method when the electrode of the component is made of bumps.

FIG. 22 is a diagram describing a position displacement amount calculation method as a component bonding method according to the fifth embodiment.

Plural bumps are formed on a component 2001 to be bonded to a flat panel 2002. In such a case, when a bonding state of only one of the bumps is selected, for example, when a bump near the center of the bumps is selected, the recognition data for bonding a bump A3 or D3 is used. Furthermore, when data of plural bumps is used, it is possible to calculate data of a position displacement amount necessary for correction. With a combination of, for example, an average of recognition results obtained from the recognition data of: A2, A3, and A4; D2, D3, and D4; A3 and D3; and B1 and B5.

FIGS. 23A and 23B are diagrams describing a position displacement amount calculation method for use in the component bonding method according to the fifth embodiment.

For obtaining the position correction data, the method of obtaining the linear approximation from the position data group of occurring indentations of the conductive particles is the same as the one described in the aforementioned embodiments. In the present diagram, since a length-to-width ratio of the shape of the bump is closer to 1:1, compared to the electrodes on the TAB board, it is possible to obtain Y15 and Y16 which are the linear approximations of the respective directions.

As described above, in the component bonding method according to the fifth embodiment, even when the electrode of the component is made of bumps, by calculating the position displacement amount of the bumps using the same method as the position correction method described in the aforementioned embodiments, it becomes possible to use the calculated amount in the preliminary press bonding process as the correction amount.

Note that when the position displacement amount of the calculated correction position data (ΔX, ΔY, and Δθ) is equal to or more than a predetermined value, it is possible to judge that a defective bonding has occurred between the electrode of the component and the electrode on the flat panel.

More specifically, this defective judgment is performed in the bonding recognition device and the press bonding device. The occurrence of an error is notified within the respective devices, or the error information and the flat panel identification information, such as an identification number of the flat panel are transmitted to the host computer connected to either the bonding recognition device or the press bonding device so as to perform the defective judgment in the latter process after the press bonding process.

Furthermore, in this defective judgment, in addition to the use of an position displacement amount, it is conceivable to measure an pressed area of an electrode on a flat panel in the case where conductive particles in the anisotropic conductive film are pressed, and to judge that a defective bonding has occurred between the electrode of the component and the electrode on the flat panel when the measured value is equal to or less than the predetermined value.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The component bonding method according to the present invention relates to a method of bonding an electrode of a component to an electrode on a flat panel, and for example, can be applied to a component mounting apparatus which includes a preliminary press bonding process and a press bonding process.

The invention claimed is:

1. A component bonding method for bonding an electrode of a component via an adhesive film to an electrode formed on an edge portion of a flat panel, said method comprising:
preliminarily press bonding the electrode of the component via the adhesive film to the electrode on the flat panel after matching a position of the electrode on the flat panel and a position of the electrode of the component;
press bonding the electrode of the component to the electrode on the flat panel;
detecting the position of the electrode on the flat panel and the position of the electrode of the component after said press bonding;
calculating a position displacement amount between the electrode of the component and the electrode on the flat panel based on the result obtained in said detecting; and
correcting the position of the electrode of the component, in said preliminarily press bonding, using the position displacement amount as a correction amount,
wherein the adhesive film includes conductive particles for conduction of electricity between the electrode of the component and the electrode on the flat panel,
said detecting further includes detecting a position data group of indentations of the conductive particles formed on an electrode area on the flat panel after said press bonding, and
said calculating includes calculating the position displacement amount using the position data group of the indentations.

2. The component bonding method according to claim 1, wherein said detecting includes detecting recognition marks formed on the flat panel and the component, and
said calculating includes calculating, as the position displacement amount, a difference between position data of the recognition mark on the flat panel and position data of the recognition mark on the component.

3. The component bonding method according to claim 1, wherein said calculating includes calculating a linear approximation of X and Y coordinates using the least squares method based on the position data group of the indentations, and calculating a position displacement amount of the electrode of the component using the linear approximation, in an X direction, and a Y direction, and a θ direction indicating a slope.

4. The component bonding method according to claim 3, wherein said calculating further includes calculating a second linear approximation orthogonal to the linear approximation, and calculating the position displacement amount of the electrode of the component based on the linear approximation and the second linear approximation.

5. The component bonding method according to claim 1, wherein said calculating further includes calculating the position displacement amount by predicting a bonded position of the electrode of the component based on: a template of matching data which corresponds to a size of a shape of the component and which is set in advance; and the position data group of the indentations of the conductive particles.

6. The component bonding method according to claim 5, wherein said calculating includes calculating a linear approximation based on the shape, and calculating the position displacement amount of the electrode of the component in an X direction, a Y direction, and a θ direction indicating a slope.

7. The component bonding method according to claim 1, wherein said calculating includes calculating: an area in which the electrode of the component and the electrode on the flat panel overlap, based on the indentations of the conductive particles; a linear approximation based on detection of an edge of the area; and the position displacement amount between the electrode of the component and the electrode on the flat panel in an X direction, and a Y direction, and a θ direction indicating a slope.

8. The component bonding method according to claim 1, wherein when the plural electrodes are formed respectively on the flat panel and the component, said detecting includes detecting one of positions of the electrodes on the flat panel and the component, and
said calculating includes calculating the position displacement amount between the electrode on the flat panel and the electrode of the component based on the position detected in said detecting.

9. The component bonding method according to claim 8, wherein said detecting further includes detecting a position of the electrode, the position being located near the center of the electrodes, and
said calculating includes calculating the position displacement amount between the electrode on the flat panel and the electrode of the component based on the position detected in said detecting.

10. The component bonding method according to claim 8, wherein said detecting includes detecting respective positions of the plural electrodes, and said calculating includes calculating an average value of the position displacement amount between the electrodes on the flat panel and the electrodes of the component as a position displacement amount to be fed back to said preliminarily press bonding.

11. The component bonding method according to claim 1, wherein plural bumps are formed on the component, and said calculating includes calculating an average value of a position displacement amount of the plural bumps or a position displacement amount of one of the plural bumps, as the position displacement amount.

12. The component bonding method according to claim 1, further comprising judging that a defective bonding has occurred between the electrode of the component and the electrode on the flat panel, when the position displacement amount calculated in said calculating is equal to or more than a predetermined value or when an area of the electrode of the component which is pressed to the electrode on the flat panel is equal to or less than a predetermined value.

* * * * *